(12) United States Patent
Lee et al.

(10) Patent No.: US 12,211,445 B2
(45) Date of Patent: Jan. 28, 2025

(54) DRIVING DEVICE AND A DISPLAY DEVICE INCLUDING THE SAME

(71) Applicant: SAMSUNG DISPLAY CO., LTD., Yongin-si (KR)

(72) Inventors: Hyo Jin Lee, Yongin-si (KR); Hui Nam, Yongin-si (KR); Se Hyuk Park, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/299,336

(22) Filed: Mar. 12, 2019

(65) Prior Publication Data

US 2019/0378458 A1 Dec. 12, 2019

(30) Foreign Application Priority Data

Jun. 7, 2018 (KR) .................. 10-2018-0065538

(51) Int. Cl.
| | | |
|---|---|---|
| *G11C 19/28* | (2006.01) | |
| *G06F 1/32* | (2019.01) | |
| *G09G 3/20* | (2006.01) | |
| *G09G 3/3258* | (2016.01) | |
| *G09G 3/3266* | (2016.01) | |
| *G09G 3/3291* | (2016.01) | |
| *H10K 59/131* | (2023.01) | |

(52) U.S. Cl.
CPC ......... *G09G 3/3258* (2013.01); *G09G 3/3266* (2013.01); *G09G 3/3291* (2013.01); *H10K 59/131* (2023.02); *G09G 2300/0413* (2013.01); *G09G 2300/0426* (2013.01); *G09G 2310/08* (2013.01)

(58) Field of Classification Search
CPC ........... G11C 19/28–287; G09G 3/3266–3677; G09G 3/22
See application file for complete search history.

(56) References Cited

U.S. PATENT DOCUMENTS

| | | |
|---|---|---|
| 9,203,395 B2 | 12/2015 | Kim et al. |
| 9,407,260 B2 | 8/2016 | Xiao |
| 9,548,026 B2 | 1/2017 | Jang |
| 9,997,101 B2 | 6/2018 | Sun et al. |
| 10,223,993 B2 | 3/2019 | Zheng |

(Continued)

FOREIGN PATENT DOCUMENTS

| | | |
|---|---|---|
| CN | 103632633 | 3/2014 |
| CN | 103943076 | 7/2014 |

(Continued)

*Primary Examiner* — Lin Li
(74) *Attorney, Agent, or Firm* — F. CHAU & ASSOCIATES, LLC

(57) ABSTRACT

A driving device includes: an output unit configured to supply a first voltage, or a second voltage lower than the first voltage, to an output terminal in response to a voltage of a first node and a voltage of a second node; a first driver configured to control the voltage of the second node in response to a signal of a first input terminal and a signal of a second input terminal; a second driver configured to control the voltage of the first node in response to a voltage of a third input terminal and the voltage of the second node; and a first transistor configured to apply a third voltage lower than the first voltage to the first node or the second node.

5 Claims, 18 Drawing Sheets

(56) References Cited

U.S. PATENT DOCUMENTS

| | | | |
|---|---|---|---|
| 10,580,361 B2 | 3/2020 | Zhu et al. | |
| RE48,358 E | 12/2020 | Jang | |
| RE49,782 E | 1/2024 | Zheng | |
| 2006/0267879 A1* | 11/2006 | Lee | G09G 3/22 345/75.2 |
| 2011/0109599 A1* | 5/2011 | Han | G09G 3/3266 345/204 |
| 2015/0194110 A1* | 7/2015 | Park | G09G 3/3614 345/213 |
| 2016/0124491 A1* | 5/2016 | An | G06F 1/3265 713/323 |
| 2016/0307535 A1* | 10/2016 | Xiao | G09G 3/3677 |
| 2016/0351152 A1* | 12/2016 | Dai | H01L 29/7869 |
| 2016/0365035 A1* | 12/2016 | Park | G09G 3/3266 |
| 2017/0084222 A1* | 3/2017 | Sun | G09G 3/32 |
| 2017/0206824 A1* | 7/2017 | Sun | G09G 3/3266 |
| 2018/0040285 A1* | 2/2018 | Sakurai | G09G 3/3655 |
| 2018/0151125 A1* | 5/2018 | Lee | G09G 3/3266 |
| 2018/0197481 A1* | 7/2018 | Choi | G09G 3/3266 |
| 2018/0261164 A1* | 9/2018 | Zhu | G11C 19/287 |
| 2018/0357974 A1* | 12/2018 | Zheng | G09G 3/3677 |
| 2019/0051365 A1* | 2/2019 | Li | G09G 3/3677 |
| 2021/0343224 A1* | 11/2021 | Wang | G09G 3/20 |

FOREIGN PATENT DOCUMENTS

| | | | | |
|---|---|---|---|---|
| CN | 105139795 | | 12/2015 | |
| CN | 106297697 | | 1/2017 | |
| CN | 107068088 A | * | 8/2017 | ............ G11C 19/28 |
| CN | 108068088 A | * | 8/2017 | ............ G11C 19/28 |
| CN | 107749276 | | 3/2018 | |
| CN | 108962157 B | * | 11/2019 | .......... G02F 3/0412 |
| KR | 10-2014-0025149 | | 3/2014 | |
| KR | 10-2014-0038148 | | 3/2014 | |
| KR | 10-2015-0086973 | | 7/2015 | |

* cited by examiner

DRIVING DEVICE AND A DISPLAY DEVICE INCLUDING THE SAME

CROSS-REFERENCE TO RELATED APPLICATION

This application claims priority under 35 U.S.C. § 119 to Korean Patent Application No. 10-2018-0065538 filed in the Korean Intellectual Property Office on Jun. 7, 2018, the disclosure of which is incorporated by reference herein in its entirety.

(a) TECHNICAL FIELD

The present invention relates to a driving device and a display device including the same.

(b) DESCRIPTION OF THE RELATED ART

Research on minimizing battery consumption of various widely used electronic devices, such as a smartphone, a laptop computer, a tablet personal computer (PC), and the like, is ongoing.

Most of these electronic devices include a display panel. By minimizing power consumption of the display panel, the battery consumption of such devices may be minimized. To reduce the power consumption of the display panel, the display panel may be driven with a relatively low frequency.

When the display panel is driven by a low-frequency driving method, a driving part which is robust and reliable should be used.

SUMMARY

An exemplary embodiment of the present invention provides a driving device including: an output unit configured to supply a first voltage, or a second voltage lower than the first voltage, to an output terminal in response to a voltage of a first node and a voltage of a second node; a first driver configured to control the voltage of the second node in response to a signal of a first input terminal and a signal of a second input terminal; a second driver configured to control the voltage of the first node in response to a voltage of the third input terminal and the voltage of the second node; and a first transistor configured to apply a third voltage lower than the first voltage to the first node or the second node.

The first input terminal may receive a signal outputted from an output terminal of a previous stage or a start signal, the second input terminal may receive a first clock signal, and the third input terminal may receive a second clock signal that has the same period as the first clock signal and a phase that does not overlap a phase of the first clock signal.

The output unit may include: a second transistor that is positioned between the first voltage and the output terminal, wherein a gate of the second transistor is connected to the first node; a third transistor that is positioned between the output terminal and the second input terminal, wherein a gate of the third transistor is connected to the second node; a first capacitor that is connected between the second node and the output terminal; and a second capacitor that is connected between the first node and the first voltage.

The first transistor may be positioned between the first node and the third voltage, wherein a gate of the first transistor is connected to a fourth input terminal, and the fourth input terminal may receive a holding control signal having an enable level after a signal is outputted from an output terminal of a last stage.

The first driver may control the voltage of the second node in response to the first clock signal, and the first driver may include: a fourth transistor that is positioned between the first input terminal and the second node, wherein a gate of the fourth transistor is connected to the second input terminal; and a fifth transistor and a sixth transistor that are connected in series between the second node and the first voltage, wherein a gate of the fifth transistor may be connected to the third input terminal, and a gate of the sixth transistor is connected to the first node.

The second driver may include: a seventh transistor that is positioned between the first node and the second input terminal, wherein a gate of the seventh transistor is connected to the second node; and an eighth transistor that is positioned between the first node and the third voltage, wherein a gate of the eighth transistor is connected to the second input terminal.

The first driver may control the voltage of the second node in response to the first clock signal, and the first driver may include: a fourth transistor that is positioned between the first input terminal and the third node, wherein a gate of the fourth transistor is connected to the second input terminal; and a fifth transistor and a sixth transistor that are connected in series between the third node and the first voltage, wherein a gate of the fifth transistor may be connected to the third input terminal, and a gate of the sixth transistor is connected to the first node.

The second driver may include: a seventh transistor that is positioned between the first node and the second input terminal, wherein a gate of the seventh transistor is connected to the third node; an eighth transistor that is positioned between the first node and the third voltage, wherein a gate of the eighth transistor is connected to the second input terminal; and the first driver includes a ninth transistor that is positioned between the second node and the third node, wherein a gate of the ninth transistor is connected to the third voltage.

The first input terminal may receive a signal outputted from an output terminal of a previous stage or a start signal, the second input terminal may receive a first clock signal, and the third input terminal may receive a second clock signal that has the same period as the first clock signal and a phase that does not overlap a phase of the first clock signal.

The output unit may include: a second transistor that is positioned between the first voltage and the first node, wherein a gate of the second transistor is connected to the second node; a third transistor that is positioned between the first voltage and the output terminal, wherein a gate of the third transistor is connected to the first node; a fourth transistor that is positioned between the third voltage and the output terminal, wherein a gate of the fourth transistor is connected to the second node; and a first capacitor that is connected between the first node and the first voltage.

The first transistor may be positioned between the second node and the third voltage wherein a gate of the first transistor is connected to a fourth input terminal, and the fourth input terminal may receive a holding control signal having an enable level after a signal is outputted from an output terminal of a last stage.

The first driver may include: a fifth transistor that is positioned between the first input terminal and the second node, wherein a gate of the fifth transistor is connected to the second input terminal; a sixth transistor that is positioned between the second input terminal and the third node, wherein a gate of the sixth transistor is connected to the second node; and a seventh transistor that is positioned between the third node and the third voltage, wherein a gate of the seventh transistor is connected to the second input terminal.

The second driver may include: an eighth transistor and a ninth transistor that are connected in series between the first voltage and the second node; a tenth transistor that is positioned between a fourth node and the third input terminal, wherein a gate of the tenth transistor is connected to the third node; an eleventh transistor that is positioned between the fourth node and the first node, wherein a gate of the eleventh transistor is connected to the third input terminal; a second capacitor that is connected between the second node and the third input terminal; and a third capacitor that is connected between the third node and the fourth node, wherein a gate of the eighth transistor may be connected to the third input terminal, and a gate of the ninth transistor is connected to the third node.

The first input terminal may receive a scan clock signal having a period that is different from the period of the first clock signal and the second clock signal.

The output unit may include: a second transistor that is positioned between the fourth input terminal and the first node, wherein a gate of the second transistor is connected to the second node; a third transistor that is positioned between the fourth input terminal and the output terminal, wherein a gate of the third transistor is connected to the first node; a fourth transistor that is positioned between the third voltage and the output terminal, wherein a gate of the fourth transistor is connected to the second node; and a first capacitor that is connected between the first node and the fourth input terminal.

The first transistor may be positioned between the second node and the third voltage, wherein a gate of the first transistor is connected to a fifth input terminal, and the fifth input terminal may receive a holding control signal having an enable level after a signal is outputted from the output terminal of a last stage.

The first driver may include: a fifth transistor and a sixth transistor that are connected in series between the first input terminal and the second node; a seventh transistor that is positioned between the third input terminal and the third node, wherein a gate of the seventh transistor is connected to the second node; and an eighth transistor that is positioned between the third node and the third voltage, wherein a gate of the eighth transistor is connected to the third input terminal, wherein a gate of the fifth transistor may be connected to the fourth input terminal, and a gate of the sixth transistor is connected to the first input terminal.

The second driver may include: a ninth transistor and a tenth transistor that are positioned in series between the first voltage and the second node; an eleventh transistor that is positioned between a fourth node and the second input terminal, wherein a gate of the eleventh transistor is connected to the third node; a twelfth transistor that is positioned between the fourth node and the first node, wherein a gate of the twelfth transistor is connected to the second input terminal; a second capacitor that is connected between a node to which the ninth transistor and the tenth transistor are connected and the second node; and a third capacitor that is connected between the third node and the fourth node, wherein a gate of the ninth transistor may be connected to the second node, and a gate of the tenth transistor is connected to the third node.

Another exemplary embodiment of the present invention provides a display device including: a display unit including a plurality of pixels; a scan driver including a plurality of stages that are respectively connected to a plurality of scan lines connected to the plurality of pixels, wherein at least one of the stages is configured to supply, as a scan signal, a first voltage or a second voltage lower than the first voltage in response to voltages applied to a first node and a second node; and a holding portion configured to control the scan driver so that the scan driver does not output a scan signal of an enable level during low-frequency driving, wherein the holding portion may apply a third voltage lower than the first voltage to the first node.

The display device may further include a light emission driver including a plurality of stages that are respectively connected to a plurality of light emission control lines connected to the plurality of pixels, wherein at least one of the stages of the light emission driver is configured to supply, as a light emission signal, a first voltage or a second voltage in response to voltages applied to a third node and a fourth node, wherein the holding portion may control the light emission driver so that the light emission driver maintains the output of a light emission control signal of an enable level during low-frequency driving and may apply the third voltage to the third node.

The display unit may include a display area in which the plurality of pixels are positioned and a non-display area surrounding the display area, the scan driver and the holding portion may be positioned in the non-display area, and the holding portion may be spaced apart from the scan driver.

DETAILED DESCRIPTION OF THE EMBODIMENTS

Figure 1:
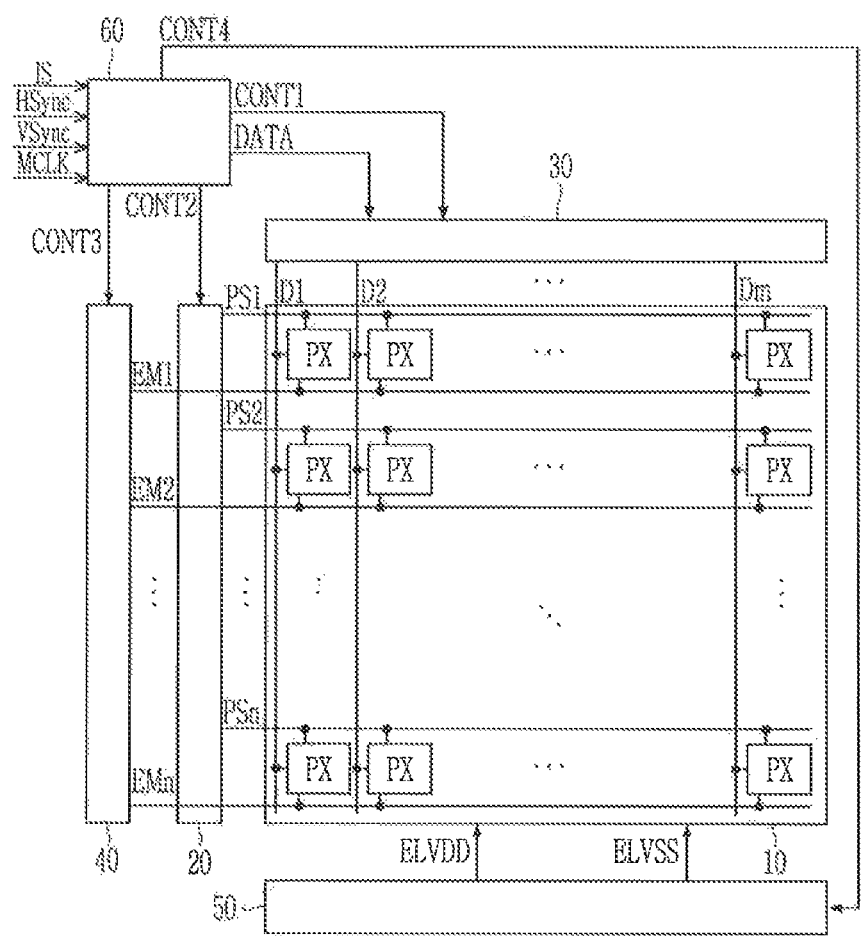
FIG. 1 illustrates a schematic block diagram of a display device according to an exemplary embodiment of the present invention.

Hereinafter, exemplary embodiments of the present invention will be described more fully with reference to the accompanying drawings. As those skilled in the art would realize, the described embodiments may be modified in various different ways, and thus, should not be limited to the embodiments set forth herein.

Like reference numerals may designate like elements throughout the specification.

It is to be understood that when one component is referred to as being "connected" or "coupled" to another component, it may be directly connected or coupled to the other component or another component may be located therebetween.

Singular forms are to include plural forms unless the context clearly indicates otherwise.

FIG. 1 illustrates a schematic block diagram of a display device according to an exemplary embodiment of the present invention.

The display device includes a display unit 10, a scan driver 20, a data driver 30, a light emission driver 40, a power supply 50, and a signal controller 60. The display device described herein with reference to FIG. 1 may include more or fewer constituent elements than those listed above.

The display unit 10 includes a plurality of pixels PX that are each connected to a corresponding one of a plurality of scan lines PS1 to PSn, a corresponding one of a plurality of data lines D1 to Dm, and a corresponding one of a plurality of light emission control lines EM1 to EMn. Each of the plurality of pixels PX emits light according to a data signal transmitted thereto, and thus, the display unit 10 may display an image.

The plurality of scan lines PS1 to PSn extend in a row direction and are substantially parallel to each other. The plurality of light emission control lines EM1 to EMn extend in a row direction and are substantially parallel to each other. The plurality of data lines D1 to Dm extend in a column direction and are substantially parallel to each other.

Each of the plurality of pixels PX receives power supply voltages ELVDD and ELVSS from the power supply 50.

The scan driver 20 is connected to the display unit 10 through the plurality of scan lines PS1 to PSn. The scan driver 20 generates a plurality of scan signals depending on a control signal CONT2 and transmits them to a corresponding one of the plurality of scan lines PS1 to PSn.

The control signal CONT2 is an operational control signal of the scan driver 20 generated and transmitted by the signal controller 60. The control signal CONT2 may include a scan start signal, clock signals switching to a low level at different times, a holding control signal, and the like. The scan start signal is a signal for generating a first scan signal for displaying an image of one frame. The clock signals included in the control signal CONT2 are synchronous signals for applying a scan signal to the plurality of scan lines PS1 to PSn. The holding control signal is a signal for controlling the scan driver 20 so that the scan driver 20 does not output a scan signal while being driven at a low frequency.

The data driver 30 is connected to each pixel PX of the display unit 10 through the plurality of data lines D1 to Dm. The data driver 30 receives an image data signal DATA and transmits a data signal to a corresponding one of the plurality of data lines D1 to Dm depending on a control signal CONT1.

The control signal CONT1 is an operational control signal of the data driver 30 generated and transmitted by the signal controller 60.

The data driver 30 selects a gray voltage depending on the image data signal DATA and transmits the selected gray voltage to the plurality of data lines D1 to Dm as a data signal. For example, the data driver 30 samples and holds the image data signal DATA inputted depending on the control signal CONT1 and transmits the plurality of data signals to the plurality of data lines D1 to Dm. The data driver 30 may apply a data signal having a predetermined voltage range to the plurality of data lines D1 to Dm while a low level scan signal is applied.

The light emission driver 40 generates a plurality of light emission control signals depending on a control signal CONT3. The control signal CONT3 may include a light emission start signal, light emission clock signals switching to a low level at different times, a holding control signal, and the like. The light emission start signal is a signal for generating a first light emission control signal for displaying an image of one frame. The clock signals included in the control signal CONT3 are synchronous signals for applying a light emission control signal to the plurality of light emission control lines Em1 to EMn. The holding control signal is a signal for controlling the light emission driver 40 so that the light emission driver 40 continuously outputs a light emission signal while being driven at a low frequency.

The signal controller 60 receives an input video signal (or image signal) IS inputted from the outside and an input control signal for controlling a display thereof. The image signal IS may include luminance information divided into grays of each of the pixels PX of the display unit 10.

The input control signal transmitted to the signal controller 60 includes a vertical synchronization signal Vsync, a horizontal synchronization signal Hsync, and a main clock signal MCLK.

The signal controller 60 generates the control signals CONT1 to CONT4 and the image data signal DATA depending on the image signal IS, the horizontal synchronization signal Hsync, the vertical synchronization signal Vsync and the main clock signal MCLK.

The signal controller 60 appropriately processes the image signal IS according to an operation condition of the display unit 10 and the data driver 30 based on the inputted image signal IS and the input control signal. For example, the signal controller 60 may generate the image data signal DATA through an image processing process such as gamma correction and luminance compensation for the image signal IS.

For example, the signal controller 60 generates the control signal CONT1 for controlling the operation of the data driver 30 and transmits the generated control signal CONT1 to the data driver 30 together with the image data signal DATA in addition, the signal controller 60 transmits the control signal CONT2 for controlling the operation of the scan driver 20 to the scan driver 20. Further, the signal controller 60 may transmit the control signal CONT3 to the light emission driver 40 to operate the light emission driver 40.

The signal controller 60 may control the driving of the power supply 50. The power supply 50 may supply the power supply voltages ELVDD and ELVSS for driving each pixel PX. For example, the signal controller 60 may transmit the control signal CONT4 to the power supply 50 to drive the power supply 50. The power supply 50 may be connected to a power supply line formed in the display unit 10.

Next, the pixel of the display device will be described in detail with reference to FIG. 2.

Figure 2:
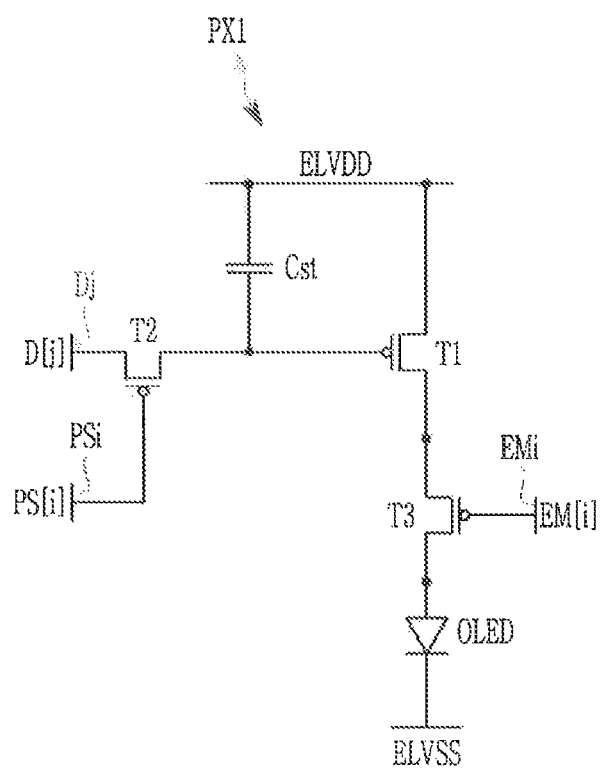
FIG. 2 illustrates a circuit diagram of a pixel included in the display device of FIG. 1.

FIG. 2 illustrates a circuit diagram of the pixel included in the display device of FIG. 1.

Referring to FIG. 2, a pixel PX1 includes a first transistor T1, a second transistor T2, a third transistor 3, a storage capacitor Cst, and an organic light emitting diode OLED.

In the pixel PX1, a gate of the first transistor T1 is connected to one end of the storage capacitor Cst, a source of the first transistor T1 is connected to the first power supply voltage ELVDD, and a drain of the first transistor T1 is electrically connected to an anode of the organic light emitting diode OLED via the third transistor T3. The first transistor T1 receives a data signal D[j] according to a switching operation of the second transistor T2 and supplies a driving current to the organic light emitting diode OLED.

A gate of the second transistor T2 is connected to a corresponding scan line PSi, a source of the second transistor T2 is connected to a corresponding data line Dj, and a drain of the second transistor T2 is connected to one end of the storage capacitor Cst together with the gate of the first transistor T1.

The second transistor T2 is turned on according to a scan signal PS[i] to perform a switching operation of transmitting the data signal D[j] to one end of the storage capacitor Cst.

A gate of the third transistor T3 is connected to a light emission control line a source of the third transistor T3 is connected to the drain of the first transistor T1, and a drain of the third transistor T3 is connected to the anode of the organic light emitting diode OLED.

The other end of the storage capacitor Cst is connected to the first power supply voltage ELVDD, and the cathode of the organic light emitting diode OLED is connected to the second power supply voltage ELVSS. Therefore, the organic light emitting diode OLED receives a driving current from the first transistor T1 and emits light, so that the display device displays an image. The capacitor Cst charges a voltage corresponding to the data signal D[j] applied to the gate of the first transistor T1 and maintains the voltage even after the second transistor T2 is turned off.

Hereinafter, a low-frequency driving method will be described with reference to FIG. 3.

Figure 3:
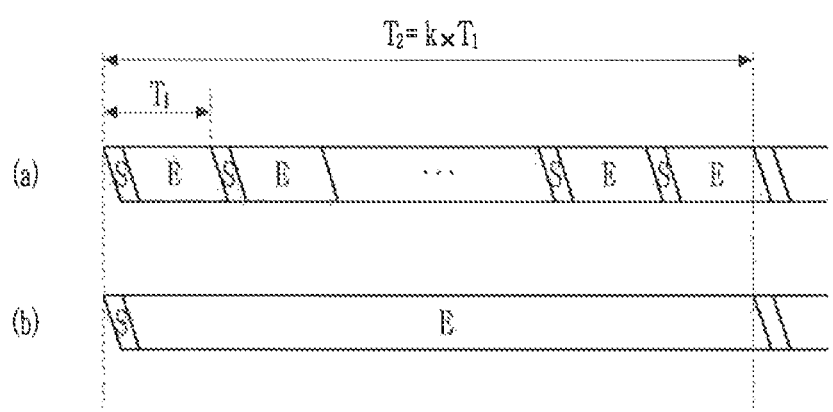
FIG. 3 illustrates a schematic diagram for explaining a driving method of the display device of FIG. 1.

As shown in FIG. 3(*a*), the display device may display one frame during a predetermined period $T_1$, thus, several (k) frames may be included in a predetermined period $T_2$ ($T_2=k*T_1$). For example, when the display device displays a motion picture, it is driven at a driving frequency $1/T_1$ of 60 Hz, thereby displaying 60 frames during 1 second ($T_2$).

Each frame may include a scan period S for writing a data signal to the pixel PX, and a light emission period E which is a period during which the pixel PX emits light depending on the data signal written to the pixel PX.

As shown in FIG. 3(*b*), the display device may display one frame during a predetermined period $T_2$. For example, when the display device displays a still image, it is driven at a driving frequency $1/T_2$ of 1 Hz, thereby displaying one frame during 1 second (T2).

One frame may include a scan period S for writing a data signal to the pixel PX, and a light emission period E which is a period during which the pixel PX emits light depending on the data signal written to the pixel PX.

A length of the light emission period E may be a length excluding the scan period S in the period $T_2$ and the scan signals transmitted to the display unit 10 during the light emission period E may have a disable level, and the light emission control signals may have an enable level.

Hereinafter, a low-frequency driving method of the display device will be described in detail with reference to FIG. 4.

Figure 4:
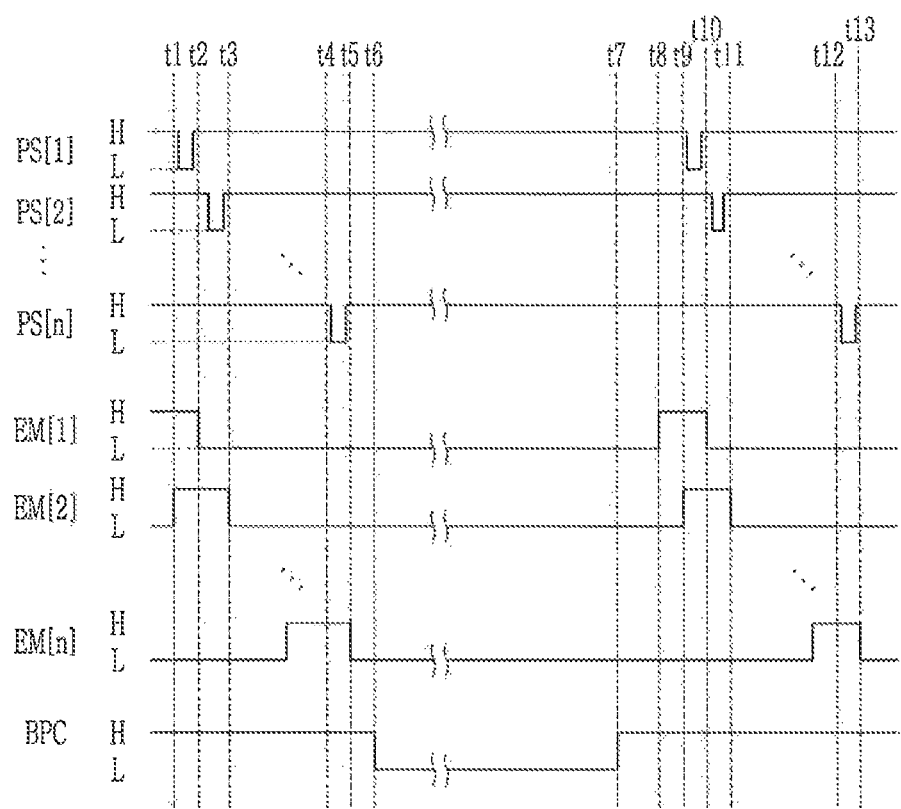
FIG. 4 illustrates a timing chart of a low-frequency driving method of the display device of FIG. 1.

FIG. 4 illustrates a timing chart of a low-frequency driving method of the display device of FIG. 1.

In one frame, a low level scan signal PS[1] is applied to a first scan line PS1 during a period of t1 to t2, and a low level scan signal PS[2] is applied to a second scan line PS2 during a period of t2 to t3. Similarly, low level scan signals are sequentially applied to third to (n−1)-th scan lines during a period of t3 to t4, and a low level scan signal PS[n] is applied to the scan line PSn during a period of t4 to t5.

After the scan signal PS[1] of a low level L is applied to the first scan line PS1 during the period of t1 to t2, a light emission control signal EM[1] of a low level L is applied to a corresponding light emission control line Em1 at time t2. For example, the light emission control signal EM[1] of a high level H transitions to the low level L at the time t2.

After the scan signal PS[2] of a low level L is applied to the second scan line PS2 during the period of t2 to t3, a light emission control signal. EM[2] of a low level L is applied to a corresponding light emission control line EM2 at time t3. For example, the light emission control signal. EM[2] of a high level H transitions to the low level L at the time t3.

After the scan signal PS[n] of the low level L is applied to the last scan line PSn during the period of t4 to t5, a light emission control signal EM[n] of the low level L is applied to a corresponding light emission control line EMn at time t5. For example, the light emission control signal EM[n] of a high level H transitions to the low level L at the time t5.

After the light emission control signals of a low level are applied to all of the light emission control lines, a low level holding control signal BPC is applied at time t6. The low level holding control signal BPC is maintained until time t7 before the light emission period ends.

The holding control signal BPC is a signal for controlling the scan driver 20 and the light emission driver 40. For example, the holding control signal BPC is provided to the scan driver 20 and the light emission driver 40 so that the scan driver 20 applies the high level scan signal to the plurality of scan lines PS1 to PSn and the light emission driver 40 applies the low level light emission control signal to the plurality of light emission control lines Em1 to EMn. This will be described later with reference to FIG. 5 to FIG. 9.

The light emission period of one frame ends at time t8. Thereafter, the scan signal PS[1] of the low level L is applied to the first scan line PS1 again during a period of t9 to t10 thus a next frame is started.

Hereinafter, the scan driver 20 of FIG. 1 will be described with reference to FIG. 5 to FIG. 8.

Figure 5:
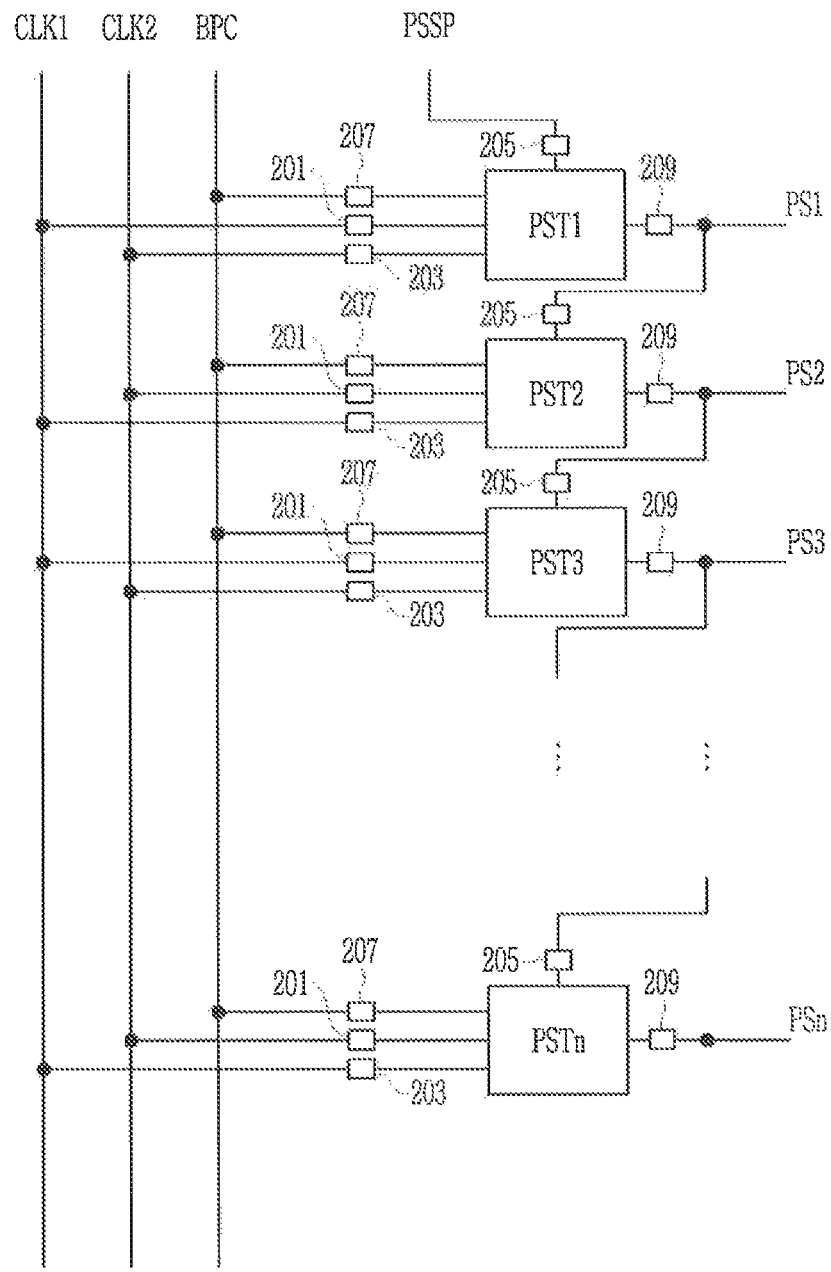
FIG. 5 illustrates a schematic diagram of a scan driver according to an exemplary embodiment of the present invention.

FIG. 5 illustrates a schematic diagram of a scan driver according to an exemplary embodiment of the present invention.

Referring to FIG. 5, the scan driver 20 includes a plurality of stages PST1 to PSTn. Each of the plurality of stages PST1 to PSTn is connected to a corresponding one of the scan lines PS1 to PSn and is driven in synchronization with first and second clock signals CLK1 and CLK2. The plurality of stages PST1 to PSTn may have the same circuit structure.

Each of the plurality of stages PST1 to PSTn receives an output signal (e.g., a scan signal) or a scan start signal PSSP of a previous stage. For example, the first stage PST1 receives the scan start signal PSSP, and the remaining stages PST2 to PSTn receive an output signal of a corresponding previous stage.

Each of the plurality of stages PST1 to PSTn receives the first clock signal CLK1 and the second clock signal CLK2. The first clock signal CLK1 and the second clock signal CLK2 have the same period, and their phases do not overlap each other. For example, when a period during which the scan signal is supplied to one scan line is one horizontal period (1H), each of the clock signals CLK1 and CLK2 may have a period of 2H, and may be switched to the low level L in a different horizontal period from each other.

Figure 6:
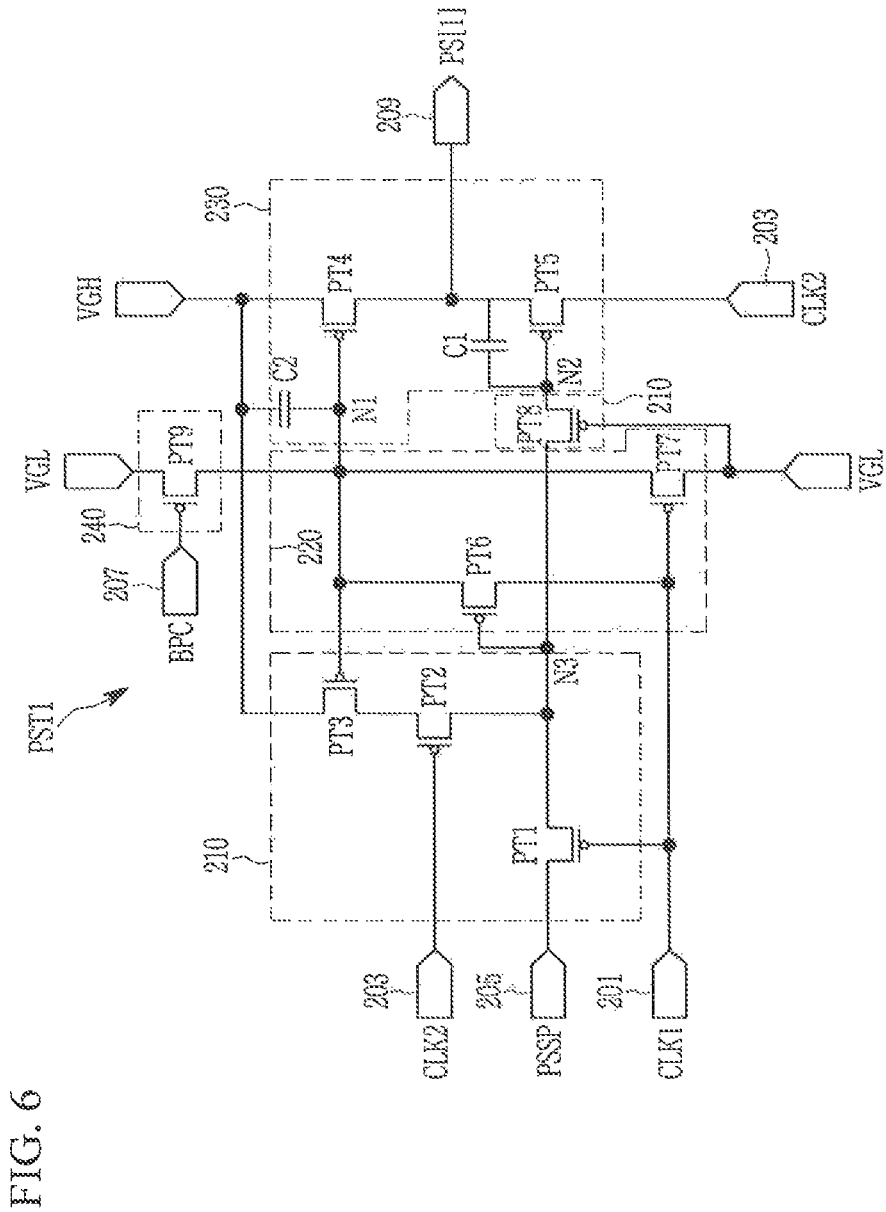
FIG. 6 illustrates a circuit diagram as an example of a stage included in a scan driver according to an exemplary embodiment of the present invention.

FIG. 6 illustrates a circuit diagram as an example of a stage included in a scan driver according to an exemplary embodiment of the present invention. In FIG. 6, although transistors are shown as P-type transistors, the present invention is not limited thereto. For example, the transistors may be N-type transistors.

Referring to FIG. 6, one stage PST1 includes a first driver 210, a second driver 220, an output unit 230 and a holding portion 240.

The output unit 230 controls a level of the scan signal PS[1] supplied to an output terminal 209 in response to voltages applied to a first node N1 and a second node N2. To accomplish this, the output unit 230 includes a fourth transistor PT4, a fifth transistor PT5 a first capacitor C1, and a second capacitor C2.

The fourth transistor PT4 is positioned between a first voltage VGH and the output terminal 209, and a gate thereof is connected to the first node N1. The fourth transistor P14 controls a connection between the first voltage VGH and the output terminal 209 in response to a voltage applied to the first node N1. In this case, the first voltage VGH is set to a high level, for example, a high-level voltage.

The fifth transistor PT5 is positioned between the output terminal 209 and a second input terminal 203, and a gate thereof is connected to the second node N2. The fifth transistor PT5 controls a connection between the output terminal 209 and the second input terminal 203 in response to a voltage applied to the second node N2.

The first capacitor C1 is connected between the second node N2 and the output terminal 209. The first capacitor C1 charges voltages corresponding to the turning-on and turning-off of the fifth transistor PT5.

The second capacitor C2 is connected between the first node N1 and the first voltage VGH. The second capacitor C2 charges a voltage applied to the first node N1.

The first driver 210 controls voltages of the second node N2 and a third node N3 in response to signals supplied to a first input terminal 201 to a third input terminal 205. To accomplish this, the first driver 210 includes a first transistor PT1, a second transistor PT2 and a third transistor PT3, and an eighth transistor PT8.

The first transistor PT1 is positioned between the third input terminal 205 and the third node N3, and a gate thereof is connected to the first input terminal 201. The first transistor PT1 controls a connection between the third input terminal 205 and the third node N3 in response to a voltage supplied to the first input terminal 201.

A second transistor PT2 and the third transistor PT3 are connected in series between the third node N3 and the first voltage VGH. For example, the second transistor PT2 is positioned between the third transistor PT3 and the third node N3, and a gate thereof is connected to the second input terminal 203. The second transistor PT2 controls a connection between the third transistor PT3 and the third node N3 in response to a voltage applied to the second input terminal 203.

The third transistor PT3 is positioned between the second transistor PT2 and the first voltage VGH, and a gate thereof is connected to the first node N1. The third transistor PT3 controls a connection between the second transistor PT2 and the first voltage VGH in response to a voltage level of the first node N1.

The eighth transistor PT8 is positioned between the second node N2 and the third node N3, and a gate thereof is connected to a second voltage VGL. The eighth transistor PT8 is turned on by the second voltage VGL to connect the second node N2 and the third node N3 to each other. In this case, the second voltage VGL is set to a low level, for example, a low-level voltage.

The second driver 220 controls a voltage of the first node N1 in response to voltage levels of the first input terminal 201 and the third node N3. To accomplish this, the second driver 220 includes a sixth transistor PT6 and a seventh transistor PT7.

The sixth transistor PT6 is positioned between the first node N1 and the first input terminal 201, and a gate thereof is connected to the third node N3. The sixth transistor PT6 controls a connection between the first node N1 and the first input terminal 201 in response to a voltage level of the third node N3.

The seventh transistor PT7 is positioned between the first node N1 and the second voltage VGL, and a gate thereof is connected to the first input terminal 201. The seventh transistor PT7 controls a connection between the first node N1 and the second voltage VGL in response to a voltage level of the first input terminal 201.

The holding portion 240 controls a voltage of the first node N1 in response to a signal supplied to a fourth input terminal 207. To accomplish this, the holding portion 240 includes a ninth transistor PT9.

The ninth transistor PT9 is positioned between the first node N1 and the second voltage VGL and a gate thereof is connected to the fourth input terminal 207. The ninth transistor PT9 controls a connection between the first node N1 and the second voltage VGL in response to a level of the holding control signal BPC supplied to the fourth input terminal 207.

Figure 7:
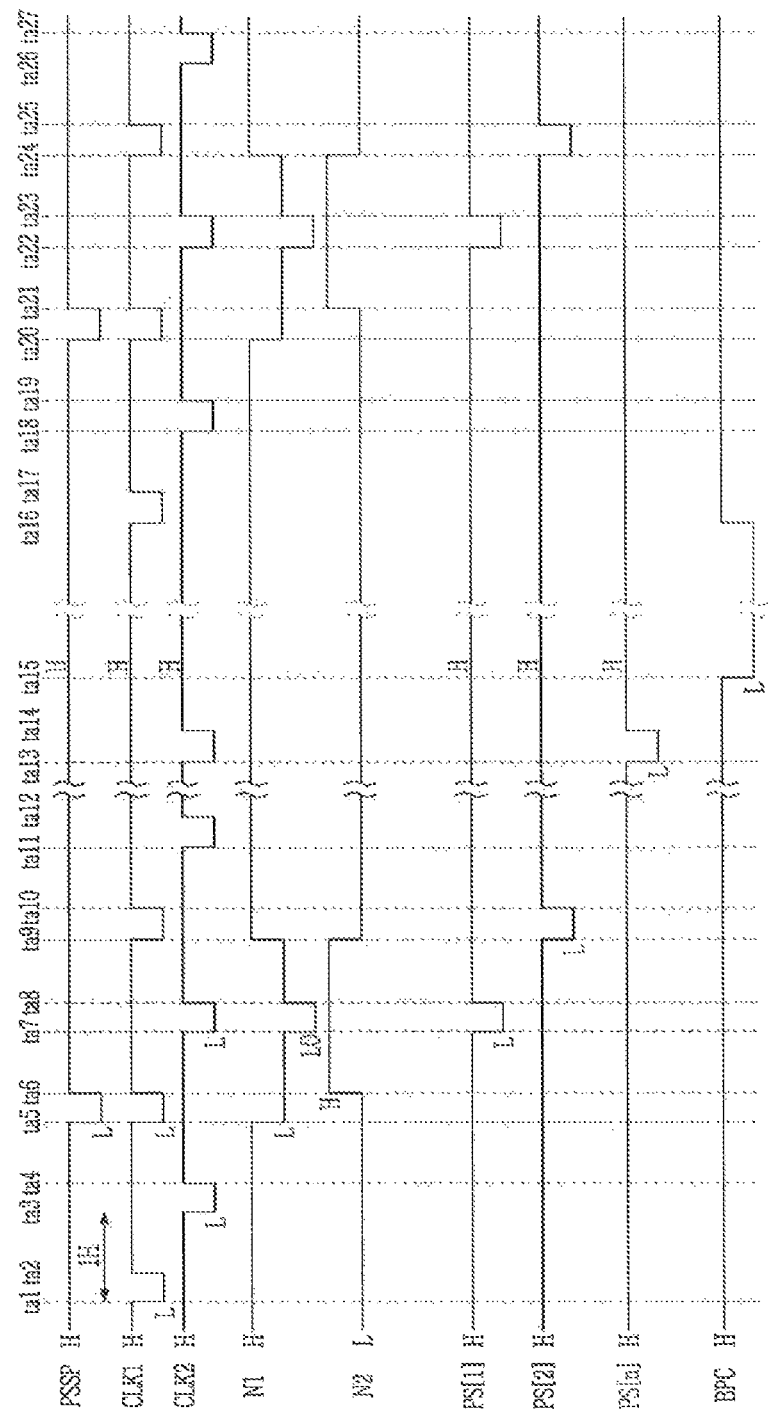
FIG. 7 illustrates a timing chart of a driving method of a scan driver according to an exemplary embodiment of the present invention.

FIG. 7 illustrates a timing chart of a driving method of a scan driver according to an exemplary embodiment of the present invention.

Referring to FIG. 7, the first clock signal CLK1 and the second clock signal CLK2 are switched to the low level L at different times (e.g., CLK1: ta1, ta5, ta9, etc., CLK2: ta3, ta7, ta11, etc.) at an interval of 1H. A low level scan start signal PSSP is supplied to be synchronized with the first clock signal CLK1 supplied to the first input terminal 201.

For example, when the first clock signal CLK1 is switched to the low level L at time ta5, the scan start signal PSSP is switched to the low level L.

When the first clock signal CLK1 of the low level L is supplied, the first transistor PT1 and the seventh transistor PT7 are turned on. When the first transistor PT1 is turned on, the third input terminal 205 and the third node N3 are electrically connected to each other. The third node N3 is set to a low-level voltage by the scan start signal PSSP of the low level supplied to the third input terminal 205. When the third node N3 is set to the low-level voltage, the sixth transistor PT6 is turned on.

In addition, the second node N2 is also set to the low-level voltage through the turned-on eighth transistor PT8. When the second node N2 is set to the low-level voltage, the fifth transistor PT5 is turned on.

When the fifth transistor PT5 is turned on, the second input terminal 203 and the output terminal 209 are electrically connected. In this case, since the second clock signal CLK2 applied to the second input terminal 203 is the high level, the high level voltage is outputted to the output terminal 209.

When the sixth transistor PT6 is turned on, the first input terminal 201 and the first node N1 are electrically connected. Then, the voltage of the first clock signal CLK1 supplied to the first input terminal 201, in other words, the low-level voltage is supplied to the first node N1. Additionally, the seventh transistor PT7 is turned on in response to the first clock signal CLK1, so that the voltage of the second voltage VGL is supplied to the first node N1. In this case, the voltage of the second voltage VGL is set to the same voltage as (or a voltage similar to) the low level of the first clock signal CLK1, so that the first node N1 stably maintains the low-level voltage.

When the low-level voltage is supplied to the first node N1, the fourth transistor PT4 and the third transistor PT3 are turned on. When the third transistor PT3 is turned on, the first voltage VGH and the second transistor PT2 are electrically connected. In this case, since the second transistor PT2 is set to an off state, even though the third transistor PT3 is turned on, the third node N3 stably maintains the low-level voltage. When the fourth transistor PT4 is turned on, the first voltage VGH is supplied to the output terminal 209. In this case, the first voltage VGH is set to the same voltage as the high-level voltage supplied to the second input terminal 203, so that the output terminal 209 stably maintains the high level.

At time ta6, the scan start signal PSSP and first clock signal CLK1 are switched to the high level. Then, the first transistor PT1 and the seventh transistor PT7 are turned off. In this case, the fifth transistor PT5 and the sixth transistor PT6 maintain the turned-on state corresponding to a voltage stored in the first capacitor C1.

When the fifth transistor PT5 maintains the turned-on state, the output terminal 209 and the second input terminal 203 maintain the electrically connected state. Accordingly, the output terminal 209 receives the high-level voltage from the second input terminal 203.

In addition, since the sixth transistor PT6 maintains the turned-on state, the first node N1 and the first input terminal 201 are electrically connected. In this case, the voltage of the first input terminal 201 is set to the high-level voltage corresponding to the first clock signal CLK1 of the high level, so that the first node N1 is also set to the high-level voltage. When the high-level voltage is supplied to the first node N1, the fourth transistor PT4 is turned off.

At time ta7, the second clock signal CLK2 is switched to the low level. The second clock signal CLK2 of the low level is supplied to the second input terminal 203. In this case, since the fifth transistor PT5 is set to the turned-on state, the second clock signal CLK2 supplied to the second input terminal 203 is supplied to the output terminal 209. In this case, the output terminal 209 outputs the second clock signal CLK2 as the scan signal PS[1] to the scan line PS1. Furthermore, in the low level period (ta7 to ta8) of the second clock signal CLK2, the voltage of the first node N1 is a level L0 which is lower than the low level L.

After the scan signal PS[1] is outputted to the scan line PS1, the first clock signal CLK1 is switched to the low level at time ta9. When the first clock signal CLK1 of the low level is supplied, the first transistor PT1 and the seventh transistor PT7 are turned on. When the first transistor PT1 is turned on, the third input terminal 205 and the third node N3 are electrically connected. In this case, the supplied scan start signal PSP is the high level, so that the third input terminal 205 is set to the high-level voltage. Accordingly, when the first transistor PT1 is turned on, the high-level voltage is supplied to the third node N3, so that the fifth transistor PT5 and the sixth transistor PT6 are turned off.

When the seventh transistor PT7 is turned on the second voltage VGL is supplied to the first node N1, so that the third transistor PT3 and the fourth transistor PT4 are turned on. When the fourth transistor PT4 is turned on, the first voltage VGH is supplied to the output terminal 209. Then, the fourth transistor PT4 and the third transistor P13 maintain the turned-on state corresponding to a voltage charged in the second capacitor C2, so that the output terminal 209 stably receives the first voltage VGH.

Additionally, when the second clock signal CLK2 is switched to the low level at time ta11, the second transistor PT2 is turned on. In this case, the third transistor PT3 is set to the turned-on state, and the first voltage VGH is supplied to the third node N3. In this case, the fifth transistor PT5 and the sixth transistor PT6 stably maintain the off state.

The outputting of the low level scan signals PS[1] to PS[n] to the scan lines PS1 to PSn is completed at time ta14. Then, at time ta15, the holding control signal BPC is switched to the low level. In this case, the first clock signal CLK1 the second clock signal CLK2 may stop clocking. In other words, the first clock signal CLK1 and the second clock signal CLK2 may maintain a high level.

When the holding control signal BPC is switched to the low level, since the second voltage VGL is supplied to the first node N1, the fourth transistor PT4 is turned on. Then, the first voltage VGH is supplied to the output terminal 209 through the turned-on fourth transistor PT4. In other words, none of the stages PST1 to PSTn of the scan driver 20 output the scan signals PS[1] to PS[n] of the low level. For example, the scan signals PS[1] to PS[n] are kept high.

Therefore, the scan driver 20 according to the present exemplary embodiment may stably maintain the scan signals PS[1] to PS[n] at the high level for a predetermined period for the low-frequency driving of the display device.

As can be gleaned, in FIG. 7, the signal cycle of ta1 to ta15 repeats starting at ta16 and proceeding at least through ta27.

Figure 8:
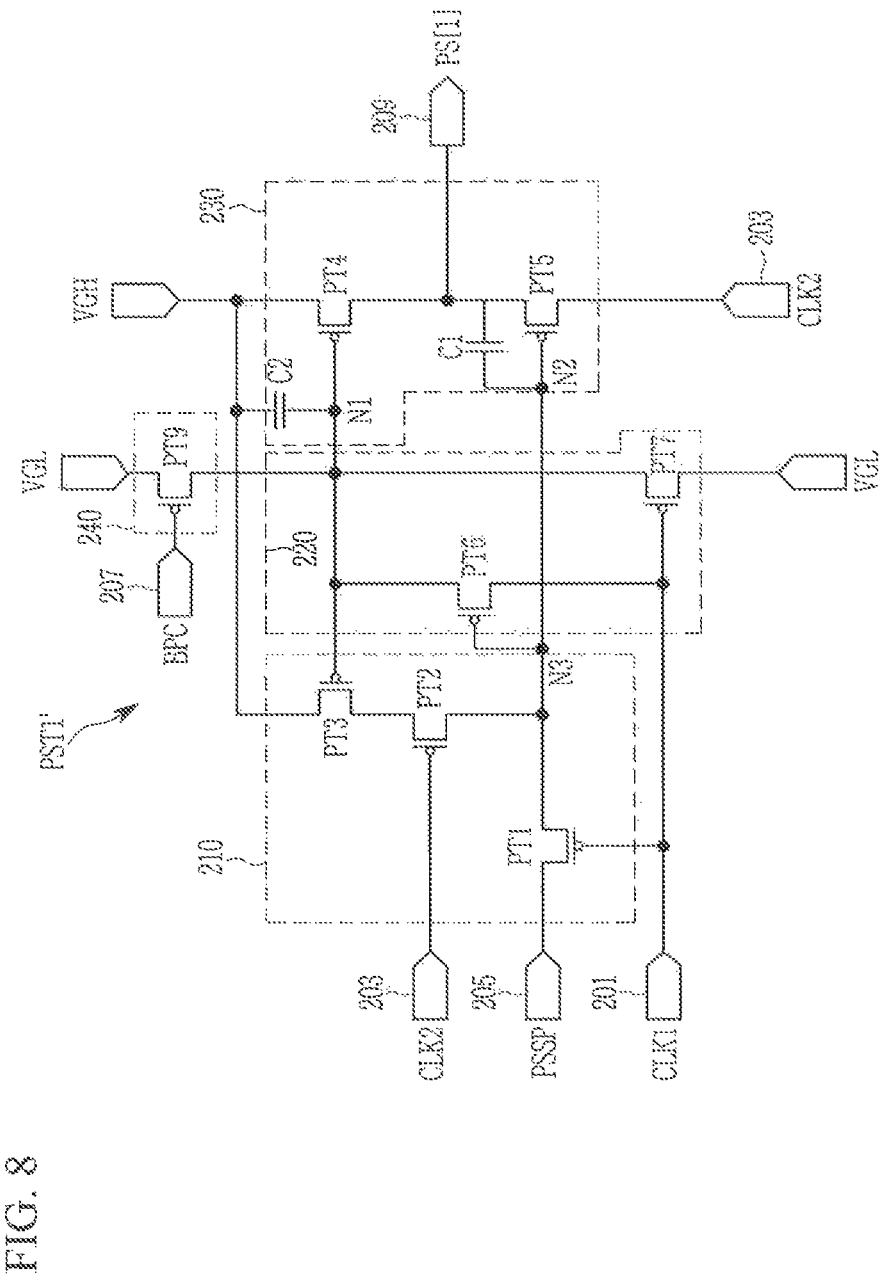
FIG. 8 illustrates a circuit diagram as another example of a stage included in a scan driver according to an exemplary embodiment of the present invention.

FIG. 8 illustrates a circuit diagram as another example of a stage included in a scan driver according to an exemplary embodiment of the present invention.

As shown in FIG. 8, a stage PST1' includes the first to seventh transistors PT1 to PT7, the ninth transistor PT9, the first capacitor C1, and the second capacitor C2, but not the eighth transistor P18, as compared with the stage PST1 shown in FIG. 6. Since a driving method of the stage PST1' is about the same as the driving method of FIG. 7, a description thereof will be omitted.

In the stage PST1' of FIG. 8, the holding control signal BPC is switched to the low level. Therefore, the second voltage VGL is supplied to the first node N1 through the turned-on ninth transistor PT9 such that the fourth transistor PT4 is turned on. Then, the first voltage VGH is supplied to the output terminal 209 through the turned-on fourth transistor PT4. In other words, none of the stages PST1' to PSTn' of the scan driver 20 output the scan signal PS[1] to PS[n] of the low level.

Therefore, the scan driver 20 according to the present exemplary embodiment may maintain the scan signals PS[1] to PS[n] at the high level for a predetermined period for the low-frequency driving of the display device.

Hereinafter, the light emission driver 40 of FIG. 1 will be described with reference to FIG. 9 to FIG. 11.

Figure 9:
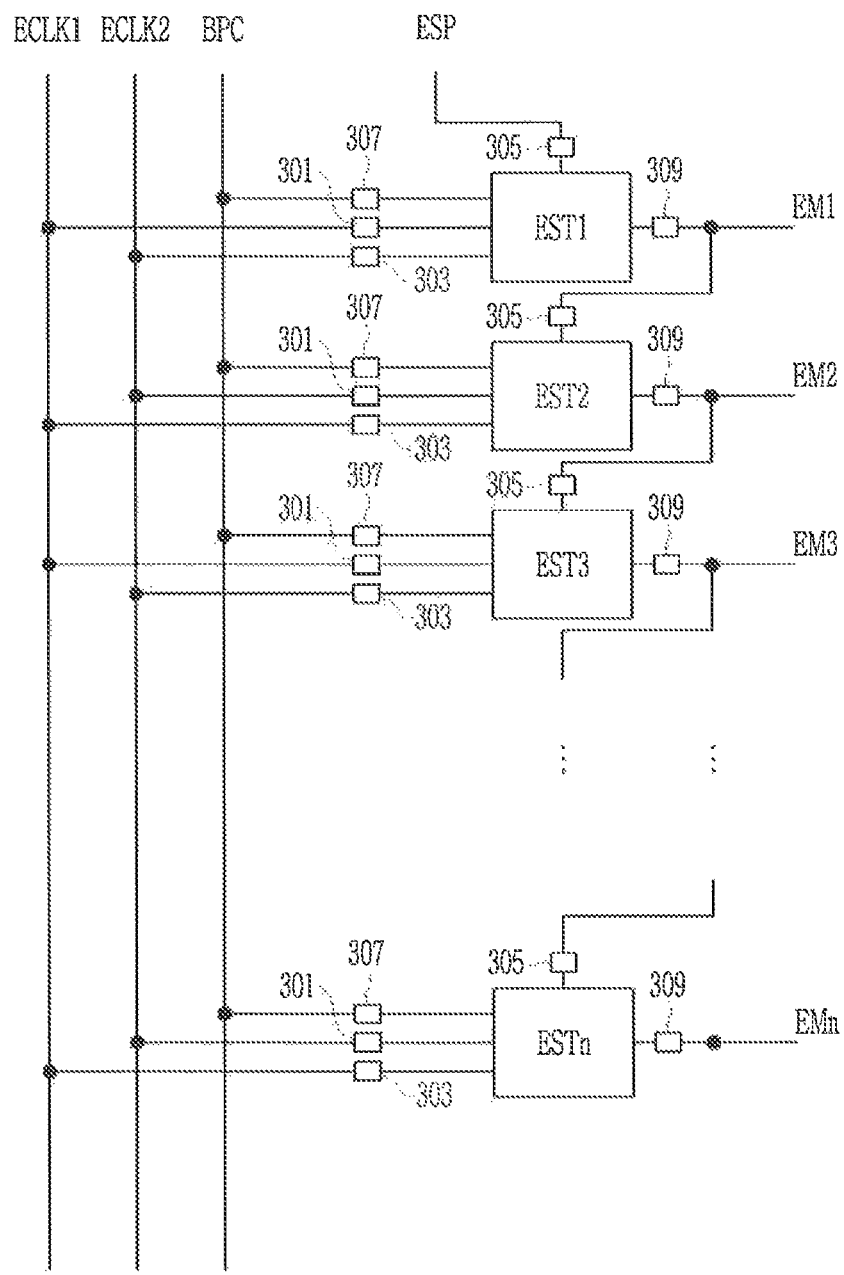
FIG. 9 illustrates a schematic diagram of a light emission driver according to an exemplary embodiment of the present invention.

FIG. 9 illustrates a schematic diagram of a light emission driver according to an exemplary embodiment of the present invention.

The light emission driver 40 includes the plurality of stages EST1 to ESTn. Each of the plurality of stages EST1 to ESTn is connected to a corresponding one of light emission control lines Em1 to EMn, and is driven in synchronization with first and second clock signals ECLK1 and ECLK2. The plurality of stages EST1 to ESTn may have the same circuit structure.

The plurality of stages EST1 to ESTn sequentially output light emission control signals. The light emission control signals overlap each other for a predetermined period when they are outputted.

Each of the plurality of stages EST1 to ESTn receives an output signal (e.g., a light emission control signal) or a light emission start signal ESP of a previous stage. For example, the first stage EST1 receives the light emission start signal ESP, and the remaining stages EST2 to ESTn receive an output signal of a corresponding previous stage.

Each of the plurality of stages EST1 to ESTn receives the first clock signal ECLK1 and the second clock signal ECLK2. The first clock signal ECLK1 and the second clock signal ECLK2 have the same period, and their phases do not overlap each other.

Figure 10:
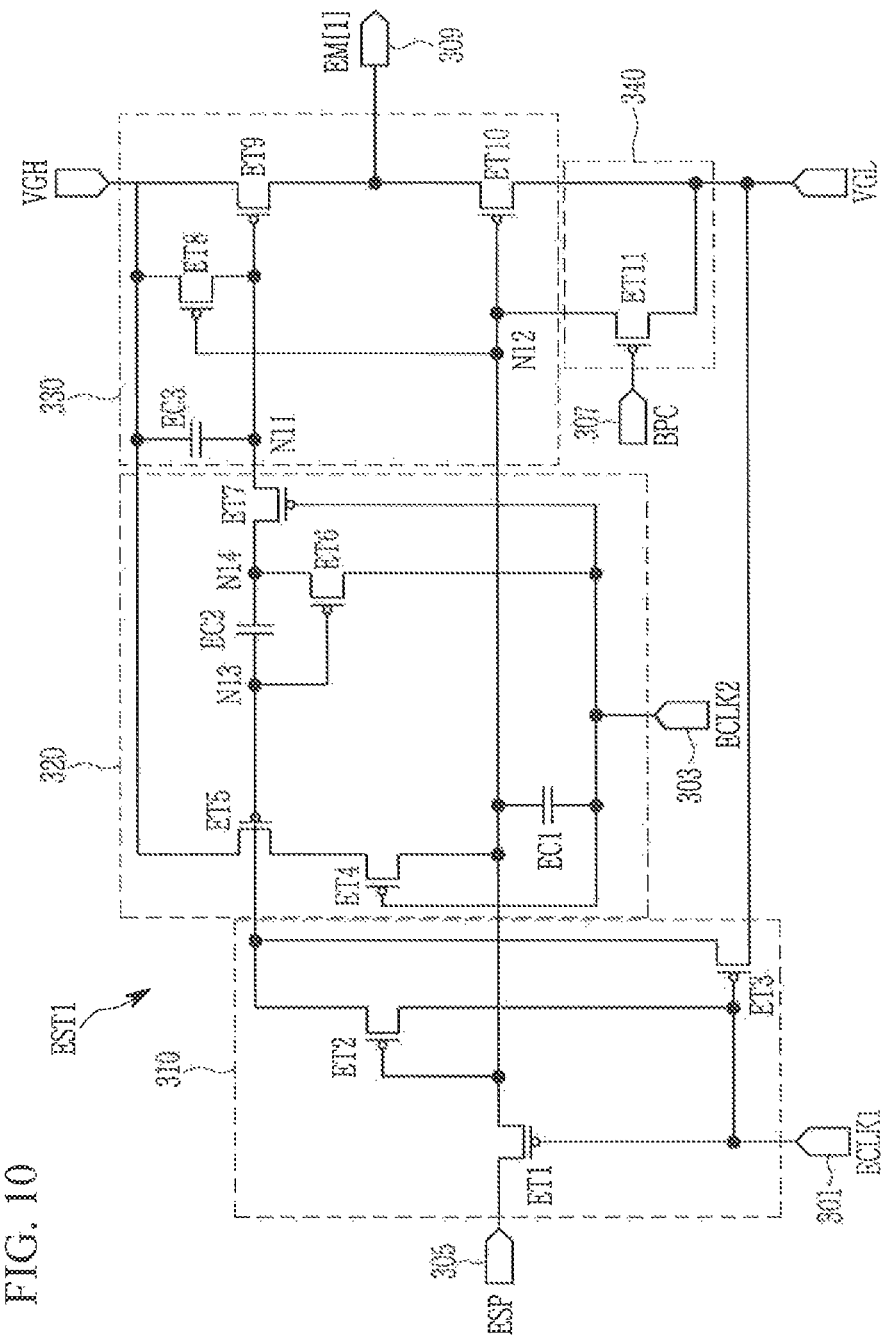
FIG. 10 illustrates a circuit diagram as an example of a stage included in a light emission driver according to an exemplary embodiment of the present invention.

FIG. 10 illustrates a circuit diagram as an example of a stage included in a light emission driver according to an exemplary embodiment of the present invention. In FIG. 10, although transistors are shown as P-type transistors, the present invention is not limited thereto. For example, the transistors may be N-type transistors.

Referring to FIG. 10, one stage EST1 includes a first driver 310, a second driver 320, an output unit 330, and a holding portion 340.

The output unit 330 controls a level of the light emission control signal EM[1] supplied to an output terminal 309 in response to voltages applied to a first node N11 and a second node N12. To accomplish this, the output unit 330 includes an eighth transistor ET8, a ninth transistor ET9, a tenth transistor ET10, and a third capacitor EC3.

The eighth transistor ET8 is positioned between the first voltage VGH and the first node N11, and a gate thereof is connected to the second node N12. The eighth transistor ET8 controls a connection between the first voltage VGH and the first node N11 in response to a voltage applied to the second node N12. In this case, the first voltage VGH is set to a high level, for example, a high-level voltage.

The ninth transistor ET9 is positioned between the first voltage VGH and the output terminal 309, and a gate thereof is connected to the first node N11. The ninth transistor ET9 controls a connection between the first voltage VGH and the output terminal 309 in response to a voltage applied to the first node N11.

The tenth transistor ET10 is positioned between the output terminal 309 and the second voltage VGL, and a gate thereof is connected to the second node N12. The tenth transistor ET10 controls a connection between the output terminal 309 and the second voltage VGL in response to a voltage applied to the second node N12. In this case, the second voltage VGL is set to the low level, for example, the low-level voltage.

The third capacitor EC3 is connected between the first node N11 and the first voltage VGH. The third capacitor EC3 charges a voltage applied to the first node N11.

The first driver 310 controls voltages of the second node N12 and the third node N13 in response to signals supplied to a first input terminal 301 and a third input terminal 305. To accomplish this, the first driver 210 includes a first transistor ET1 to a third transistor ET3.

The first transistor ET1 is positioned between the third input terminal 305 and the second node N12, and a gate thereof is connected to the first input terminal 301. The first transistor ET1 controls a connection between the third input terminal 305 and the second node N12 in response to a voltage supplied to the first input terminal 301.

A second transistor ET2 is positioned between the third node N13 and the first input terminal 301, and a gate thereof is connected to the second node N12. The second transistor ET2 controls a connection between the first input terminal 301 and the third node N13 in response to a voltage level of the second node N12.

The third transistor ET3 is positioned between the third node N13 and the second voltage VGL, and a gate thereof is connected to the first input terminal 301. The third transistor ET3 controls a connection between the third node N13 and the second voltage VGL in response to a voltage supplied to the first input terminal 301.

The second driver 320 controls voltages of the first node N11, the second node N12, and a fourth node N14 in response to voltage levels of a second input terminal 303 and the third node N13. To accomplish this, the second driver 320 includes a fourth transistor ET4, a fifth transistor ET5, a sixth transistor ET6, a seventh transistor ET7, a first capacitor EC1 and a second capacitor EC2.

The fourth transistor ET4 and the fifth transistor ET5 are connected in series between the second node N12 and the first voltage VGH. For example, the fourth transistor ET4 is positioned between the fifth transistor ET5 and the second node N12, and a gate thereof is connected to the second input terminal 303. The fourth transistor ET4 controls a connection between the fifth transistor ET5 and the second node N12 in response to a voltage supplied to the second input terminal 303.

The fifth transistor ET5 is positioned between the fourth transistor ET4 and the first voltage VGH, and a gate thereof is connected to the third node N13. The fifth transistor ET5 controls a connection between the fourth transistor ET4 and the first voltage VGH in response to a voltage level of the third node N13.

The sixth transistor ET6 is positioned between the fourth node N14 and the second input terminal 303, and a gate thereof is connected to the third node N13. The sixth transistor ET6 controls a connection between the fourth node N14 and the second input terminal 303 in response to a voltage level of the third node N13.

The seventh transistor ET7 is positioned between the fourth node N14 and the first node N11, and a gate thereof is connected to the second input terminal 303. The seventh transistor ET7 controls a connection between the fourth node N14 and the first node N11 in response to a voltage level of the second input terminal 303.

The first capacitor EC1 is connected between the second node N12 and the second input terminal 303, and the second capacitor EC2 is connected between the first node N11 and the fourth node N14.

The holding portion 340 controls a voltage of the second node N12 in response to a signal supplied to a fourth input terminal 307. To accomplish this, the holding portion 340 includes an eleventh transistor ET11.

The eleventh transistor ET11 is positioned between the second node N12 and the second voltage VGL, and a gate thereof is connected to the fourth input terminal 307. The eleventh transistor ET11 controls a connection between the second node N12 and the second voltage VGL in response to a level of the holding control signal BPC supplied to the fourth input terminal 307.

Figure 11:
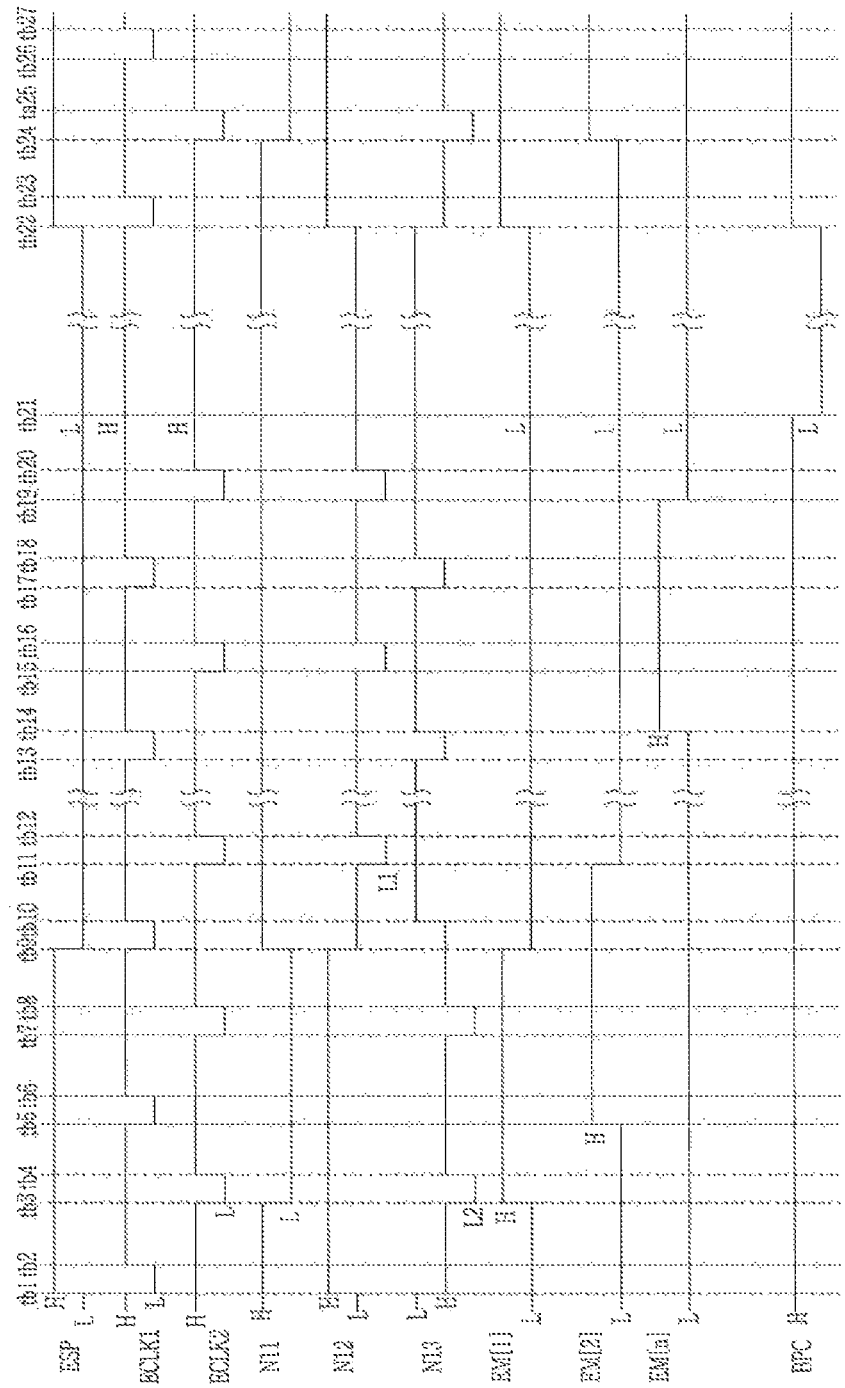
FIG. 11 illustrates a timing chart of a driving method of a light emission driver according to an exemplary embodiment of the present invention.

FIG. 11 illustrates a timing chart of a driving method of a light emission driver according to an exemplary embodiment of the present invention.

Referring to FIG. 11, a first clock signal ECLK1 and the second clock signal ECLK2 are switched to the low levels L at different times (e.g., ECLK1: tb1, tb5, tb9, etc., ECLK2: tb3, tb7, tb11, etc.). A high level light emission start signal ESP is supplied to be synchronized with the first clock signal ECLK1 supplied to the first input terminal 301.

For example, when the first clock signal ECLK1 is switched to the low level L at time tb1, the light emission start signal ESP is switched to the high level H. The light emission start signal ESP is provided only to the first stage EST1, and may maintain the high level for the period of time tb1 to time tb9.

When the first clock signal ECLK1 of the low level L is supplied, the first transistor ET1 and the third transistor ET3 are turned on.

When the first transistor ET1 is turned on, the third input terminal 305 and the second node N12 are electrically connected. The second node N12 is set to the high-level voltage by the high level light emission start signal ESP supplied to the third input terminal 305. When the second node N12 is set to the high-level voltage, the second transistor ET2, the eighth transistor ET8, and the tenth transistor ET10 are turned off.

When the third transistor ET3 is turned on, the third node N13 and the second voltage VGL are electrically connected, and thus, the second voltage VGL is supplied to the third node N13. In this case, the voltage of the second voltage VGL is set to the same voltage as (or a voltage similar to) the low level of the first clock signal ECLK1.

When the third node N13 is set to the low-level voltage, the fifth transistor ET5 and the sixth transistor ET6 are turned on.

When the fifth transistor ET5 is turned on, the first voltage VGH and the fourth transistor ET4 are electrically connected. In this case, since the fourth transistor ET4 is set to an off state, even though the fifth transistor ET5 is turned on, the second node N12 maintains the high level.

When the sixth transistor ET6 is turned on, the second input terminal 303 and the fourth node N14 are electrically connected. In this case, since the second clock signal ECLK2 applied to the second input terminal 303 has the high level, the high-level voltage is also outputted to the fourth node N14.

The seventh transistor ET7 is in an off state by the second clock signal ECLK2 having the high level. The voltage of the first node N11 maintains the high level by the third capacitor EC3. Since the voltage of the first node N11 maintains the high level, the ninth transistor ET9 is in the off state. Accordingly, the light emission control signal EM[1] maintains the low-level voltage.

At time tb3, the second clock signal ECLK2 is switched to the low level. The light emission start signal ESP and the first clock signal ECLK1 maintain the high level.

The first transistor ET1 and the third transistor ET3 are in the off state by the first clock signal ECLK1 having the high level. Since the voltage of the second node N12 maintains the high level, the second transistor ET2, the eighth transistor ET8, and the tenth transistor ET10 are in the off state.

The second clock signal ECLK2 of the low level is supplied to the second input terminal 303. In this case, the fourth transistor ET4 and the seventh transistor ET7 are turned on. In addition, since the voltage of the third node N13 is the low level, the fifth transistor ET5 and the sixth transistor ET6 are in an on state.

The voltage of the third node N13 is bootstrapped by a potential change amount of the second clock signal ECLK2 by the coupling of the second capacitor EC2. In other words, in the low level period (tb3 to tb4) of the second clock signal ECLK2, the voltage of the third node N13 is a level L2 which is lower than the low level L in the low level period (tb11 to tb12) of the second clock signal ECLK2, the voltage of the second node N12 is a level L1 which is lower than the low level L.

The second clock signal ECLK2 having the low level is provided to the first node N11 through the turned-on sixth and seventh transistors ET6 and ET7. Accordingly, at time tb3, the voltage of the first node N11 is the low level. Since the voltage of the first node N11 is the low level, the ninth transistor ET9 is turned on.

Since the ninth transistor ET9 is turned on and the tenth transistor ET10 is in the off state, the light emission control signal EM[1] is switched to the high level.

At time tb9, the first clock signal ECLK1 is switched to the low level, and the light emission start signal ESP is switched to the low level. The second clock signal ECLK2 maintains the high level.

The first clock signal ECLK1 having the low level is provided to the gate of the first transistor ET1 and the gate of the third transistor ET3. Accordingly, the first transistor ET1 and the third transistor ET3 are turned on.

The light emission start signal ESP having the low level is provided to the gate of the second transistor ET2 and the second node N12 through the turned-on first transistor ET1. Accordingly, the voltage of the second node N12 is the low level, and the second transistor ET2 is turned on.

The first clock signal ECLK1 having the low level is provided to the third node N13 through the turned-on second transistor ET2, and the first voltage VGL is provided to the third node N13 through the turned-on third transistor ET3. Accordingly, the voltage of the third node N13 is the low level.

The second clock signal ECLK2 having the high level is provided to the fourth transistor ET4 and the seventh transistor ET7. Accordingly, the fourth and seventh transistors ET4 and ET7 are in the off state.

Since the voltage of the second node N12 is the low level, the eighth transistor ET8 is turned on. The first voltage VGH is provided to the first node N11 through the turned-on eighth transistor ET8. Accordingly, the voltage of the first node N11 is the high level. Since the voltage of the first node N11 is the high level, the ninth transistor ET9 is turned off.

Since the voltage of the second node N12 is the low level, the tenth transistor ET10 is turned on. The second voltage VGL is provided to the output terminal 309 by the turned-on tenth transistor ET10. Accordingly, the first light emission control signal EM[1] has the low level.

At time tb19, the output of the scan signal EM[n] of the low level is started from the last stage ESTn to the light emission control line EMn. Then, at time tb21, the holding control signal BPC is switched to the low level. In this case, the first clock signal ECLK1 and the second clock signal ECLK2 may stop clocking. For example, the first dock signal ECLK1 may be kept high and the second clock signal ECLK2 may be kept high. Time tb21 of FIG. 11 may correspond to time ta15 of FIG. 7.

When the holding control signal BPC is switched to the low level, since the second voltage VGI, is supplied to the second node N12, the tenth transistor ET10 is turned on. Then, the second voltage VGL is supplied to the output terminal 309 through the turned-on tenth transistor ET10. In other words, all of the stages EST1 to ESTn of the light emission driver 40 maintain the outputs of the low level light emission control signals EM[1] to EM[n].

Therefore, the light emission driver 40 according to the present exemplary embodiment may stably maintain the light emission control signals EM[1] to EM[n] at the low level for a predetermined period for the low-frequency driving of the display device.

As can be gleaned, in FIG. 11, the signal cycle of tb1 to tb21 repeats starting at tb22 and proceeding at least through tb27.

Hereinafter, a display device according to another exemplary embodiment of the present invention will be described with reference to FIG. 12 to FIG. 17.

Figure 12:
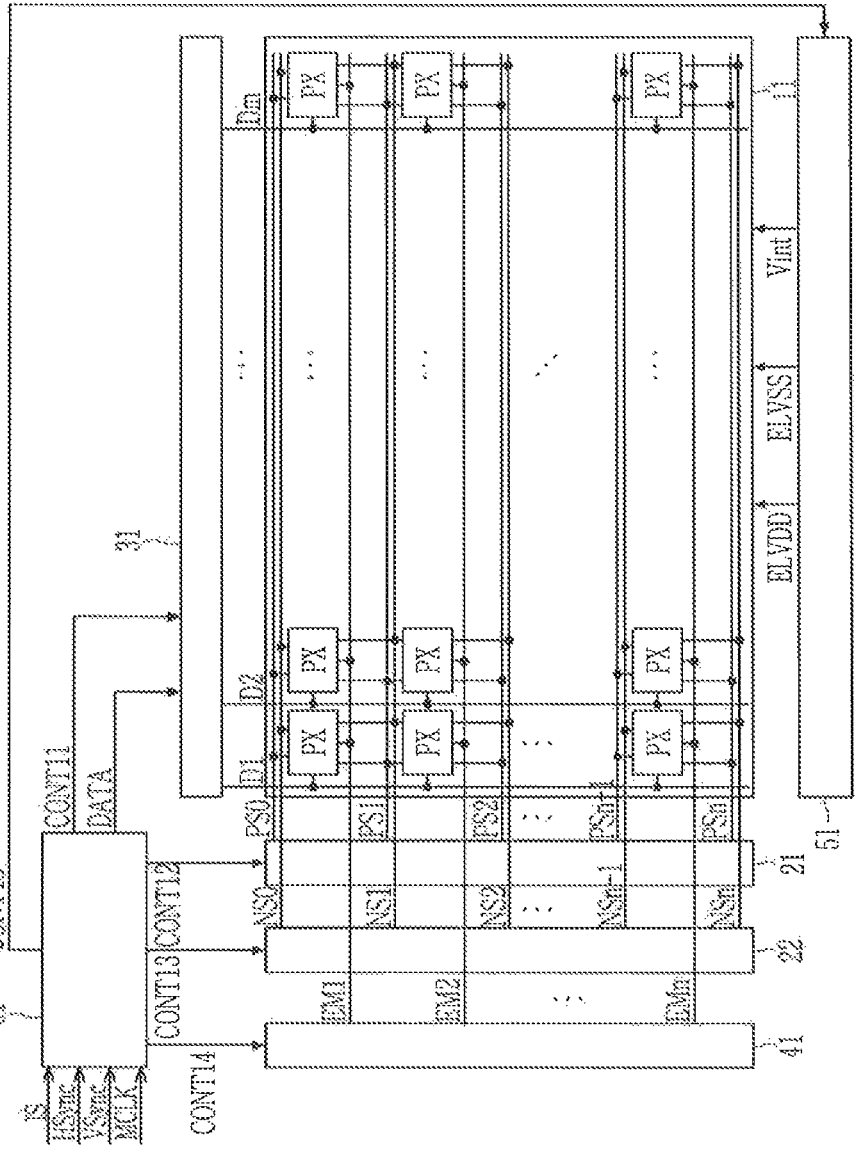
FIG. 12 illustrates a schematic block diagram of a display device according to another exemplary embodiment of the present invention.

FIG. 12 illustrates a schematic block diagram of a display device according to another exemplary embodiment of the present invention.

The display device includes a display unit 11, a first scan driver 21, a second scan driver 22, a data driver 31, a light emission driver 41, a power supply 51, and a signal controller 61. The display device described herein with reference to FIG. 12 may include more or fewer elements than those listed above.

Descriptions of the same or similar elements to those of the display device of FIG. 1 among the elements of the display device shown in FIG. 12 may be omitted.

The display unit 11 includes a plurality of pixels PX that are each connected to a corresponding one of the plurality of first scan lines PS0 to PSn, a corresponding one of the plurality of second scan lines NS0 to NSn, a corresponding one of the plurality of data lines D1 to Dm, and a corresponding one of a plurality of light emission control lines EM1 to EMn. Each of the plurality of pixels PX emits light according to a data signal transmitted thereto, and thus, the display unit 11 may display an image.

A plurality of first scan lines PS0 to PSn extend in a row direction and are substantially parallel to each other. A plurality of second scan lines NS0 to NSn extend in a row direction and are substantially parallel to each other. The plurality of light emission control lines EM1 to EMn extend in a row direction and are substantially parallel to each other. The plurality of data lines D1 to Dm extend in a column direction and are substantially parallel to each other.

Each of the plurality of pixels PX receives an initialization voltage Vint and the power supply voltages ELVDD and ELVSS from the power supply 51.

The second scan driver 22 is connected to the display unit 11 through the plurality of second scan lines NS0 to NSn. The second scan driver 22 generates a plurality of scan signals depending on the control signal CONT12 and transmits them to a corresponding one of the plurality of scan lines PS0 to PSn.

The signal controller 61 receives an input video signal (or image signal) IS inputted from the outside and an input control signal for controlling display thereof. The signal controller 61 generates control signals CONT11 to CONT15 and the image data signal DATA depending on the image signal IS, the horizontal synchronization signal Hsync, the vertical synchronization signal Vsync, and the main clock signal MCLK.

The signal controller 61 may control the driving of the power supply 51. The power supply 51 may supply the initialization voltage Vint for initializing a gate of a first transistor included in each pixel PX of the display unit 11 and an anode of an organic light emitting diode to a predetermined voltage. In addition, the power supply 51 may provide the power supply voltages ELVDD and ELVSS for driving each pixel PX. For example, the signal controller 61 may transmit the control signal CONT15 to the power supply 51 to drive the power supply 51. The power supply 51 may be connected to a power supply line formed in the display unit 11.

Hereinafter, the pixel of the display device will be described in detail with reference to FIG. 13.

Figure 13:
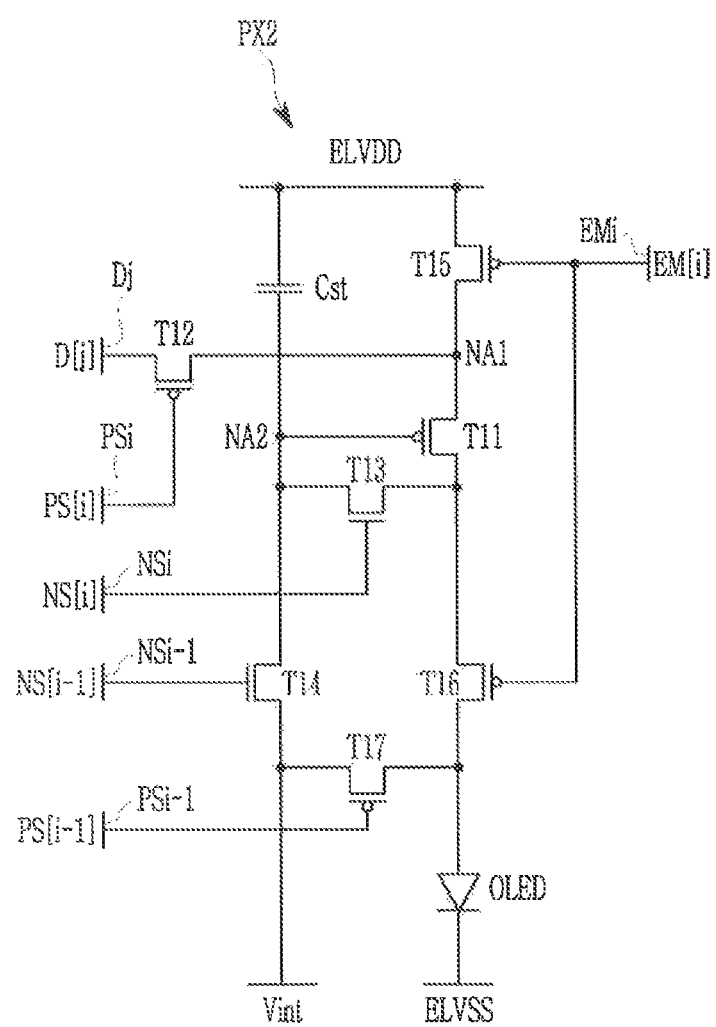
FIG. 13 illustrates a circuit diagram of a pixel included in the display device of FIG. 12.

FIG. 13 illustrates a circuit diagram of a pixel included in the display device of FIG. 12.

Referring to FIG. 13, a pixel PX2 of a display device according to another exemplary embodiment of the present invention includes first to seventh transistors T11, T12, T13, T14, T15, T16, and T17, a storage capacitor Cst, and an organic light emitting diode OLED.

In the pixel PX2, a gate of the first transistor T11 is connected to one end of the storage capacitor Cst, a source of the first transistor T11 is connected to the first power supply voltage ELVDD via the fifth transistor T15, and a drain of the first transistor T11 is electrically connected to an anode of the organic light emitting diode OLED via the sixth transistor T16. The first transistor T11 receives the data signal D[j] according to a switching operation of the second transistor T12 to supply a driving current to the organic light emitting diode OLED.

A gate of the second transistor T12 is connected to a corresponding first scan line PSi, a source of the second transistor T12 is connected to a corresponding data line Dj, and a drain of the second transistor T12 is connected to the source of the first transistor T11 and is connected to the first power supply voltage ELVDD via the fifth transistor T15.

The second transistor T12 performs a switching operation in which the second transistor T12 is turned on depending on the scan signal PS[i] to transmit the data signal D[j] to the source of the first transistor T11.

A gate of the third transistor T13 is connected to a corresponding second scan line NSi, a source of the third transistor T13 is connected to the drain of the first transistor T11 and is connected to the anode of the organic light emitting diode OLED via the sixth transistor T16, and a drain of the third transistor T13 is connected to one end of the storage capacitor Cst, a source of the fourth transistor T14, and the gate of the first transistor T11.

The third transistor T13 is turned on depending on the second scan signal NS[i] received through the corresponding second scan line NSi to connect the gate and the drain of the first transistor T11 to each other, thereby diode-connecting the first transistor T11.

A gate of the fourth transistor T14 is connected to a previous second scan line NSi−1, drain of the fourth transistor 114 is connected to the initialization voltage Vint, and the source of the fourth transistor T14 is connected to the drain of the third transistor T13.

The fourth transistor T14 is turned on depending on a scan signal NS[i−1] received through the previous second scan line NSi−1 to transmit the initialization voltage Vint to the gate of the first transistor T11, thus an operation for initializing a voltage of the gate of the first transistor T11 is performed.

A gate of the fifth transistor T15 is connected to a corresponding light emission control line EMi, a source of the fifth transistor T15 is connected to the first power supply voltage ELVDD, and a drain of the fifth transistor T15 is connected to the source of the first transistor T11 and the drain of the second transistor T12.

A gate of the sixth transistor T16 is connected to the corresponding light emission control line EMi, a source of the sixth transistor T16 is connected to the drain of the first transistor T11 and the source of the third transistor T13, and a drain of the sixth transistor T16 is connected to the anode of the organic light emitting diode OLED and the source of the seventh transistor T17.

The fifth transistor T15 and the sixth transistor T16 are simultaneously turned on depending on the light emission control signal EM[i] received through the light emission control line Emi. In this case, a driving current flows through the organic light emitting diode OLED by the first power supply voltage ELVDD and the voltage stored in the storage capacitor Cst.

A gate of the seventh transistor T17 is connected to a previous first scan line (PSi−1), a drain of the seventh transistor T17 is connected to the initialization voltage Vint, and a source of the seventh transistor T17 is connected to the anode of the organic light emitting diode OLED and the drain of the sixth transistor T16.

The seventh transistor T17 is turned on depending on a scan signal PS[i−1] received through the previous first scan line PSi−1. In this case, the seventh transistor T17 performs an operation for initializing a voltage of the anode of the organic light emitting diode OLED with the initialization voltage Vint.

The other end of the storage capacitor Cst is connected to the first power supply voltage ELVDD, and the cathode of the organic light emitting diode OLED is connected to the second power supply voltage ELVSS. Accordingly, the organic light emitting diode OLED receives a driving current from the first transistor T11 to emit light, so that the display device displays an image.

The pixel PX2 includes an oxide semiconductor thin film transistor and a low temperature poly silicon (LTPS) thin film transistor.

The oxide semiconductor thin film transistor includes a gate, a source, and a drain. The oxide semiconductor thin film transistor includes an active layer made of an oxide semiconductor. Herein, the oxide semiconductor may include an amorphous or crystalline oxide semiconductor. The oxide semiconductor thin film transistor may be an N-type transistor.

The LTPS thin film transistor includes a gate, a source, and a drain. The LTPS thin film transistor includes an active layer made of polysilicon. The LTPS thin film transistor may be a P-type or N-type thin film transistor. In the present exemplary embodiment, the LTPS thin film transistor is a P-type transistor.

The LTPS thin film transistor has high electron mobility and thus a fast driving characteristic.

The oxide semiconductor thin film transistor may be manufactured by a low temperature process, and it has lower charge mobility than the LTPS thin film transistor. The oxide semiconductor thin film transistor has an excellent off-current characteristic.

The first transistor T11, the second transistor T12, the fifth transistor 115, the sixth transistor T16, and the seventh transistor T17 may be P-type LTPS thin film transistors, and the third transistor T13 and the fourth transistor T14 may be N-type oxide semiconductor thin film transistors.

In the present exemplary embodiment, when the third transistor T13 and the fourth transistor T14 connected to the second node NA2 are the oxide semiconductor thin film transistors, a leakage current from the second node NA2 is minimized, thus an image with a desired luminance may be displayed.

In addition, in the present exemplary embodiment, the first transistor T11, the sixth transistor T16, and the seventh transistor T17, which are positioned at a current supply path for supplying a current to the organic light emitting diode OLED, are the LTPS thin film transistors. When the first, sixth and seventh transistors T11, T16, and T17 positioned at the current supply path are the LTPS thin film transistors, a current may be stably supplied to the organic light emitting diode OLED by fast driving characteristics thereof.

Hereinafter, a low-frequency driving method of the display device of FIG. 12 will be described in detail with reference to FIG. 14.

Figure 14:
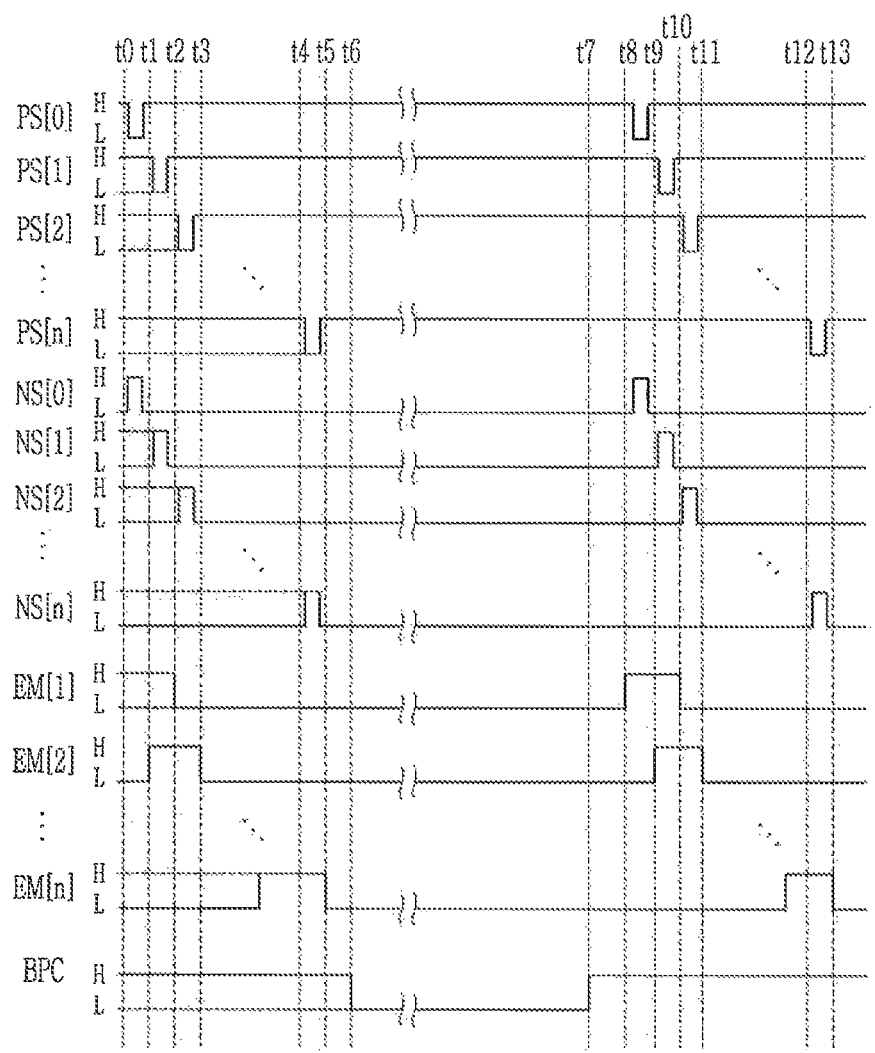
FIG. 14 illustrates a timing chart of a low-frequency driving method of the display device of FIG. 12.

FIG. 14 illustrates a timing chart of the low-frequency driving method of the display device of FIG. 12.

In one frame, during a period of t0 to t1, a low-level first scan signal PS[0] is applied to a dummy first scan line PS0, and a high-level second scan signal NS[0] is applied to a dummy second scan line NS0. During a period of t1 to t2, the low-level first scan signal PS[1] is applied to the first-first scan line PS1, and the high-level second scan signal NS[1] is applied to the first-second scan line NS1. Similarly, the low-level first scan signals are sequentially applied to the second to (n−1)-th first scan lines PS2 to PSn−1, and the low-level second scan signals are sequentially applied to the second to (n−1)-th second scan lines NS2 to NSn−1. During a period of t4 to t5, the low-level first scan signal PS[n] is applied to the n-th first scan line PSn, and the high-level second scan signal NS[n] is applied to the n-th second scan line NSn.

After the first the scan signal PS[1] of the low level L and the second scan signal NS[1] of the high level 11 are respectively applied to the first-first scan line PS1 and the first-second scan line NS1 during the period of t1 to t2, the light emission control signal EM[1] of the low level L is applied to a corresponding light emission control line Em1 at time t2.

After the first scan signal PS[2] of the low level L and the second scan signal NS[2] of the high level H are respectively applied to the second-first scan line PS2 and the second-second scan line NS2 during a period of t2 to t3, the light emission control signal EM[2] of the low level L is applied to a corresponding light emission control line EM2 at time t3.

After the first scan signal PS[n] of the low level L and the second scan signal NS[n] of the high level H are respectively applied to the last-first scan line PSn and the last-second scan line NSn during the period of t4 to t5, the light emission control signal EM[n] of the low level L is applied to a corresponding light emission control line EMn at time t5.

After the low level light emission control signals EM[1] to EM[n] are applied to all of the light emission control lines Em1 to EMn, the low level holding control signal BPC is applied at time t6. The low level holding control signal BPC is maintained until time t7 before the light emission period ends.

The holding control signal BPC is a signal for controlling the first and second scan drivers 21 and 22 and the light emission driver 41, and is provided to the first and second scan drivers 21 and 22 and the light emission driver 41 so that the first scan driver 21 applies the high level first scan signal to the plurality of scan lines PS1 to PSn, the second scan driver 22 applies the low-level second scan signal to the plurality of scan lines NS1 to NSn, and the light emission driver 41 applies the low level light emission control signal to the plurality of light emission control lines EM1 to EMn.

Next, the light emission period of one frame ends at time t8. During a subsequent period of t9 to t10, the first scan signal PS[0] of the low level L and the second scan signal NS[0] of the high level H are respectively applied to the dummy first scan line PS0 and the dummy second scan line NS0 again, and thereby a next frame is started and proceeds at least to t13.

Hereinafter, the second scan driver 22 of FIG. 12 will be described with reference to FIG. 15 to FIG. 18.

Figure 15:
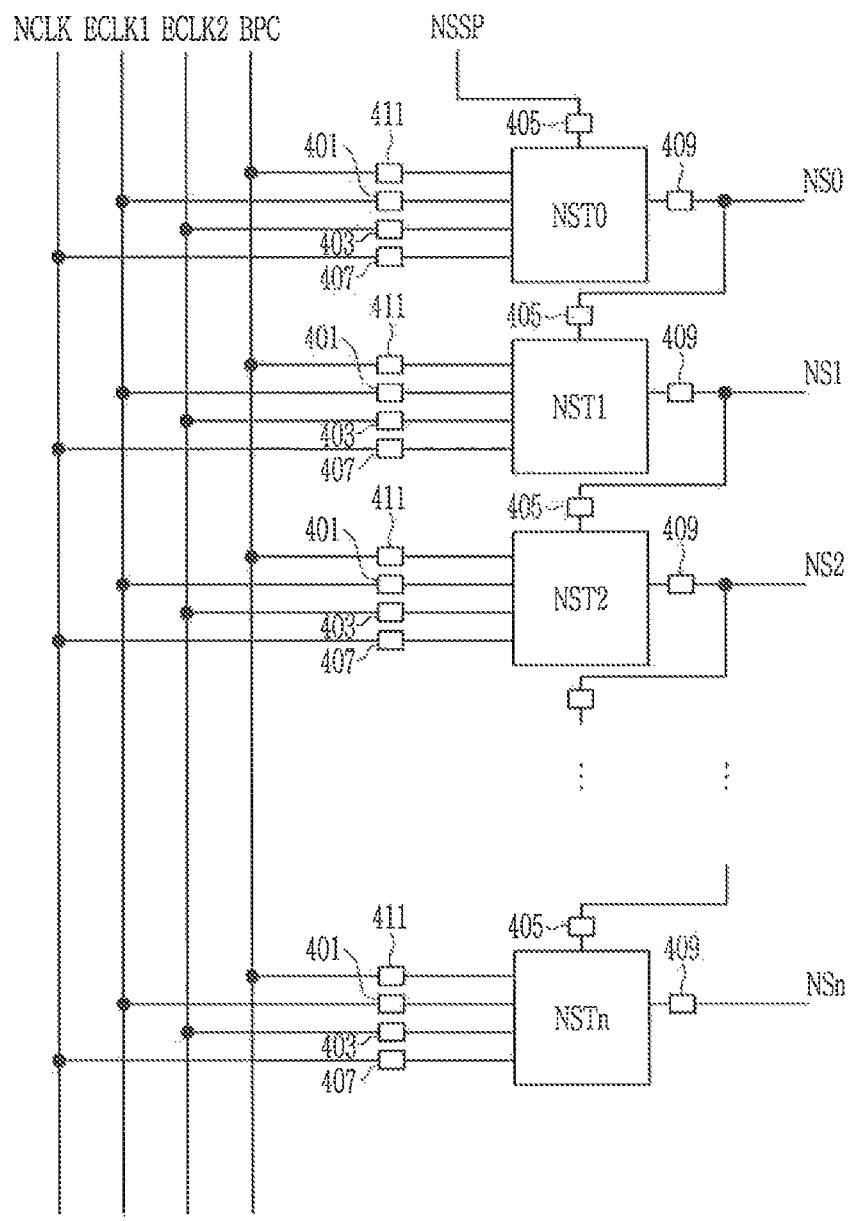
FIG. 15 illustrates a schematic diagram of a scan driver according to another exemplary embodiment of the present invention.
Figure 16:
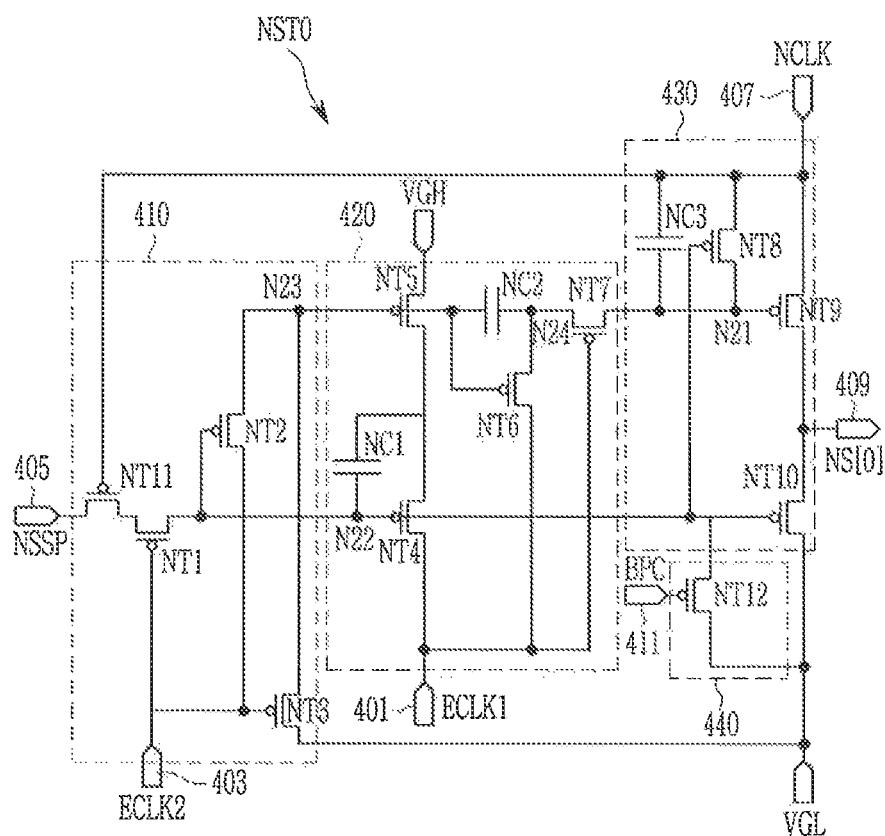
FIG. 16 illustrates a circuit diagram as an example of a stage included in a scan driver according to another exemplary embodiment of the present invention.

FIG. 15 illustrates a schematic diagram of a scan driver according to another exemplary embodiment of the present invention, and FIG. 16 illustrates a circuit diagram of a stage included in a scan driver according to another exemplary embodiment of the present invention.

Referring to FIG. 15, the second scan driver 22 includes a plurality of stages NST0 to NSTn. Each of the plurality of stages NST0 to NSTn is connected to a corresponding one of scan lines NS0 to NSn and is driven in synchronization with clock signals ECLK1, ECLK2, and NCLK. The plurality of stages NST0 to NSTn may have the same circuit structure.

Each of the plurality of stages NST0 to NSTn receives an output signal of a previous stage (e.g., a second scan signal) or a second scan start signal NSSP. For example, the first stage NST0 receives the second scan start signal NSSP, and the remaining stages NST1 to NSTn receive an output signal of a corresponding previous stage.

Each of the plurality of stages NST0 to NSTn receives the first clock signal ECLK1 and the second clock signal ECLK2. The first clock signal ECLK1 and the second clock signal ECLK2 have the same period, and their phases do not overlap each other.

The plurality of stages NST0 to NSTn receive the scan clock signal NCLK. The scan clock signal NCLK has a period different from the first clock signal ECLK1 and the second clock signal ECLK2. When a period during which the scan signal is supplied to one scan line NS0 is one horizontal period (1H), the scan clock signal NCLK may have a period of 1H, and may be switched to the high level L.

Referring to FIG. 16, one stage NST0 includes a first driver 410, a second driver 420, an output unit 430, and a holding portion 440. In FIG. 16, although transistors are shown as P-type transistors, the present invention is not limited thereto. For example, the transistors may be N-type transistors.

The output unit 330 controls a level of the scan signal NS[0] supplied to an output terminal 409 in response to a voltage applied to a first node N21 and a second node N22. To accomplish this, the output unit 430 includes an eighth transistor NT8, a ninth transistor NT9, tenth transistor NT10, and a third capacitor NC3.

The eighth transistor NT8 is positioned between the fourth input terminal 407 provided with the scan clock signal NCLK and the first node N21, and a gate thereof is connected to the second node N22. The eighth transistor NT8 controls a connection between the fourth input terminal 407 and the first node N21 in response to a voltage applied to the second node N22.

The ninth transistor NT9 is positioned between the fourth input terminal 407 and the output terminal 409, and a gate thereof is connected to the first node N21 The ninth transistor NT9 controls a connection between the fourth input terminal 407 and the output terminal 409 in response to a voltage applied to the first node N21.

The tenth transistor NT10 is positioned between the output terminal 409 and the second voltage VGL, and a gate thereof is connected to the second node N22. The tenth transistor NT10 controls a connection between the output terminal 409 and the second voltage VGL in response to a voltage applied to the second node N22. In this case, the second voltage VGL is set to a low level, for example, a low-level voltage.

The third capacitor NC3 is connected between the first node N21 and the first voltage VGH. The third capacitor NC3 is charged with a voltage applied to the first node N21.

The first driver 410 controls voltages of the second node N22 and the third node N23 in response to signals supplied to a second input terminal 403, a third input terminal 405, and a fourth input terminal 407. To accomplish this, the first driver 410 includes an eleventh transistor NT11, and a first transistor NT1 to a third transistor NT3.

The eleventh transistor NT11 is positioned between the third input terminal 405 and the first transistor NT1, and a gate thereof is connected to the fourth input terminal 407. The eleventh transistor NT11 controls a connection between the third input terminal 405 and the first transistor NT1 in response to a voltage supplied to the fourth input terminal 407.

The first transistor NT1 is positioned between the eleventh transistor NT11 and the second node N22, and a gate thereof is connected to the second input terminal 403. The first transistor NT1 controls a connection between the eleventh transistor NT11 and the second node N22 in response to a voltage supplied to the second input terminal 403.

In other words, the eleventh transistor NT11 and the first transistor NT1 may transmit the second scan start signal NSSP to the second node N22 depending on the levels of the scan clock signal NCLK and the second clock signal ELCK2.

The second transistor NT2 is positioned between the third node N23 and the second input terminal 403, and a gate thereof is connected to the second node N22. The second transistor NT2 controls a connection between the second input terminal 403 and the third node N23 in response to a voltage level of the second node N22.

The third transistor NT3 is positioned between the third node N23 and the second voltage VGL, and a gate thereof is connected to the second input terminal 403. The third transistor NT3 controls a connection between the third node N23 and the second voltage VGL in response to a voltage supplied to the second input terminal 403.

The second driver 420 controls voltages of the first node N21, the second node N22, and a fourth node N24 in response to voltage levels of a first input terminal 401 and the second node N22. To accomplish this, the second driver 420 includes a fourth transistor NT4, a fifth transistor NT5, a sixth transistor NT6, a seventh transistor NT7, a first capacitor NC1, and a second capacitor NC2.

The fourth transistor NT4 is positioned between the first input terminal 401 and the fifth transistor NT5, and a gate thereof is connected to the second node N22. The fourth transistor NT4 controls a connection between the fifth transistor NT5 and the first input terminal 401 in response to a voltage level of the second node N22.

The fifth transistor NT5 is positioned between the fourth transistor NT4 and the first voltage VGH, and a gate thereof is connected to the third node N23. The fifth transistor NT5 controls a connection between the fourth transistor NT4 and the first voltage VGH in response to a voltage level of the third node N23.

The sixth transistor NT6 is positioned between the fourth node N24 and the first input terminal 401, and a gate thereof is connected to the third node N23. The sixth transistor NT6 controls a connection between the fourth node N24 and the first input terminal 401 in response to a voltage level of the third node N23.

The seventh transistor NT7 is positioned between the fourth node N24 and the first node N21, and a gate thereof is connected to the first input terminal 401. The seventh transistor NT7 controls a connection between the fourth node N24 and the first node N21 in response to a voltage level of the first input terminal 401.

The first capacitor NC1 is connected to a node between the fourth transistor NT4 and the fifth transistor NT5 and to the second node N22, and the second capacitor NC2 is connected to a node between the fifth transistor NT5 and the sixth transistor NT6 and to the fourth node N24.

The holding portion 440 controls a voltage of the second node N22 in response to a signal supplied to a fifth input terminal 411. To accomplish this, the holding portion 440 includes a twelfth transistor NT12.

The twelfth transistor NT12 is positioned between the second node N22 and the second voltage VGL, and a gate thereof is connected to the fifth input terminal 411. The twelfth transistor NT12 controls a connection between the second node N22 and the second voltage VGL in response to a level of the holding control signal BPC supplied to the fifth input terminal 411.

Figure 17:
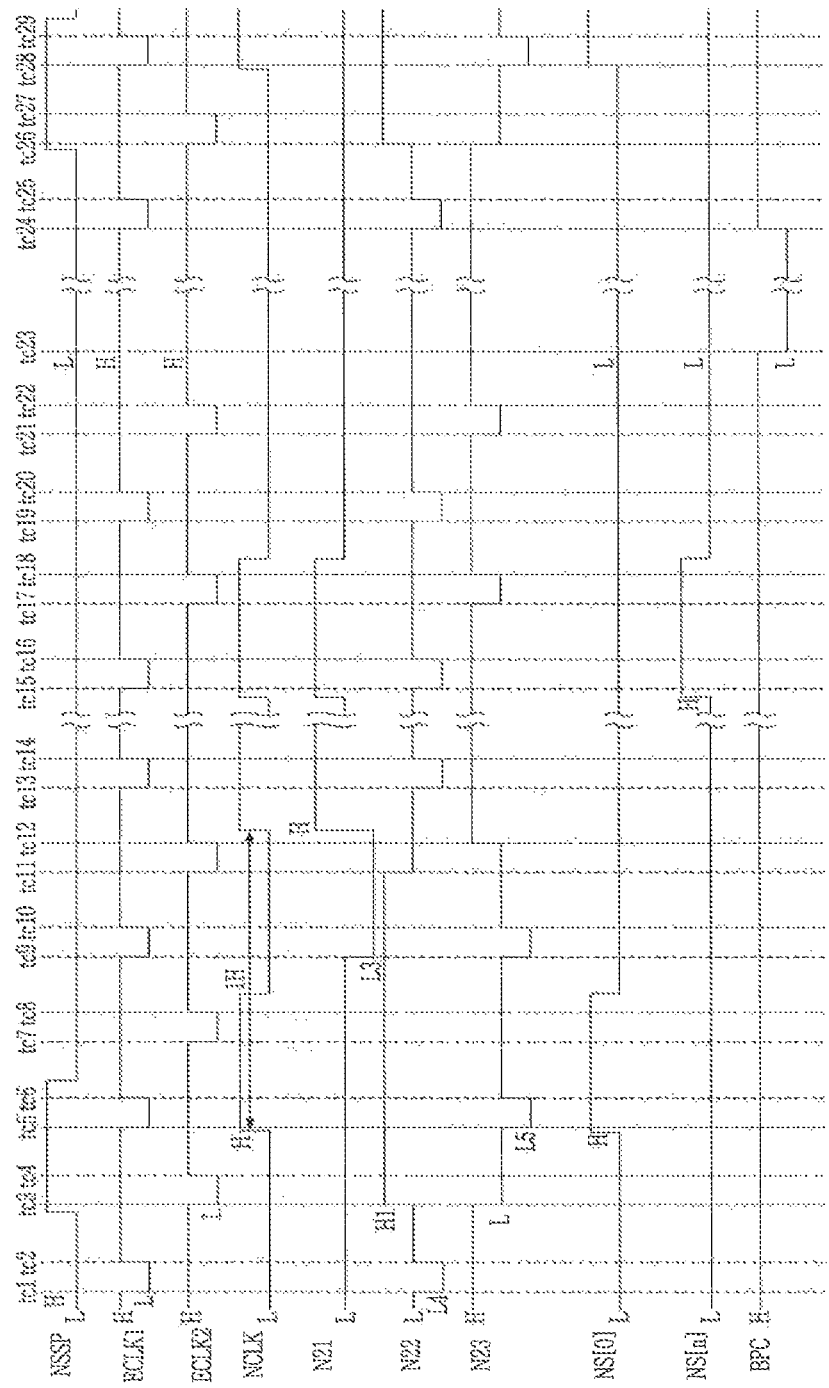
FIG. 17 illustrates a timing chart of a driving method of a scan driver according to another exemplary embodiment of the present invention.

FIG. 17 illustrates a timing chart of a driving method of a scan driver according to another exemplary embodiment of the present invention.

Referring to FIG. 17, the first clock signal ECLK1 and the second clock signal ECLK2 are switched to the low level L at different times (e.g., ECLK1: tc1, tc5, tc9, etc., ECLK2: tc3, tc7, tc11, etc). The high level second scan start signal NSSP is supplied to be synchronized with the first clock signal ECLK1 supplied to the first input terminal 401.

For example, the first clock signal ECLK1 is switched to the low level at time tc1 the second scan start signal NSSP and the scan clock signal NCLK maintain the low level, and the second dock signal ECLK2 maintains the high level. In addition, the voltages of the first node N21 and the second node N22 have the low level.

Since the voltage of the second node N22 is the low level, the second transistor NT2, the fourth transistor NT4, the eighth transistor NT8, and the tenth transistor NT10 are in the on state.

The high level second clock signal ECLK2 is provided to the third node N23 by the second transistor NT2 of the on state. In other words, the voltage of the third node N23 is the high level H.

The second voltage VGL is supplied to the output terminal 409 by the tenth transistor NT10 of the on state. The stage NST0 of the scan driver 22 outputs the low-level second scan signal NS[0].

The low level scan clock signal NCLK is supplied to the first node N21 by the eighth transistor NT8 of the on state. The voltage of the first node N21 stably maintains the low level.

Since the voltage of the first node N21 is the low level, the ninth transistor NT9 is in the on state. The low level scan clock signal NCLK is supplied to the output terminal 409 by the ninth transistor NT9 of the on state. The stage NST0 of the scan driver 22 stably outputs the low-level second scan signal NS[0].

During a period of tc1 to tc2, the low-level first clock signal ECLK1 is supplied to the first input terminal 401. The voltage of one end of the first capacitor NC1 is changed by a potential change amount of the first clock signal ECLK1 by the fourth transistor NT4 of the on state. The voltage of the second node N22 is bootstrapped by the potential change amount of the first clock signal ECLK1 by coupling of the first capacitor NC1. In other words, in the low level period (tc1 to tc2) of the first clock signal ECLK1, the voltage of the second node N22 is a level L4 which is lower than the low level L.

The seventh transistor NT7 is turned on by the low-level first clock signal ECLK1. The first node N21 and the fourth node N24 are electrically connected by the turned-on seventh transistor NT7. Since the voltage of the first node N21 is the low level, the voltage of the fourth node N24 is the low level.

Then, the second capacitor NC2 charges a voltage difference between the third node N23 of the high level H and the fourth node N24 of the low level.

At time tc3, the second clock signal ECLK2 is switched to the low level L. The scan clock sig al NCLK maintains the low level, and the first clock signal ECLK1 maintains the high level.

Before the second clock signal ECLK2 is switched to the low level L, the second scan start signal NSSP is switched to the high level H. The second scan start signal NSSP is provided only to the first stage NST0, which may maintain the high level within a period of tc3 to about tc7. The first clock signal ECLK1 maintains the high level to tc5.

The eleventh transistor NT11 is in the on state by the scan clock signal NCLK of the low level L. When the second clock signal ECLK2 of the low level L is supplied, the first transistor NT1 and the third transistor NT3 are turned on. Then, the second scan start signal NSSP of the high level H is provided to the second node N22 through the turned-on first transistor NT1, and the second voltage VGL is supplied to the third node N23 through the turned-on third transistor NT3. Accordingly, the voltage of the second node N22 is the high level, and the voltage of the third node N23 is the low level.

Since the voltage of the third node N23 is the low level, the fifth transistor NT5 and the sixth transistor NT6 are turned on. Since the first voltage VGH is provided to one end of the first capacitor NC1 connected to the fourth transistor NT4 through the turned-on fifth transistor NT5, the high level voltage is applied to opposite ends of the first capacitor NC1 to be discharged.

The first clock signal ECLK1 of the high level H is provided to the fourth node N24 through the turned-on sixth transistor NT6. Then, the second capacitor NC2 charges a voltage difference between the first clock signal ECLK1 of the high level H and the third node N23 of the low level.

At time tc5, the first clock signal ECLK1 is switched to the low level L. The first clock signal ECLK1 and the second scan start signal NSSP maintain the high level.

Before the first clock signal ECLK1 is switched to the low level L, the scan clock signal NCLK is switched to the high level H. The scan clock signal NCLK may maintain the high level within a period tc5 to about tc9.

The eleventh transistor NT11 is turned off by the scan clock signal NCLK having the high level.

In addition, before the first clock signal ECLK1 is switched to the low level L, the voltage of the second node N22 is the high level, and the voltage of the third node N23 is the low level.

Since the voltage of the second node N22 is the high level, the second transistor NT2, the fourth transistor NT4, the eighth transistor NT8, and the tenth transistor NT10 are in the off state.

Since the voltage of the third node N23 is the low level, the fifth transistor NT5 and the sixth transistor NT6 are in the on state.

The first voltage VGH is provided to one end of the first capacitor NC1 connected to the fourth transistor NT4 through the fifth transistor NT5 of the on state.

The voltage of one end of the second capacitor NC2 is changed by a potential change amount of the first clock signal ECLK1 by the sixth transistor NT6 of the on state. The voltage of the third node N23 is bootstrapped by the potential change amount of the first clock signal ECLK1 by the coupling of the second capacitor NC2. In other words, in the low level period (tc5 to tc6) of the first clock signal ECLK1 the voltage of the third node N23 is a level L5 which is lower than the low level L.

In addition, the low-level first clock signal ECLK1 is provided to the fourth node N24 by the sixth transistor NT6 of the on state.

The seventh transistor NT7 is turned on by the low-level first clock signal ECLK1. The fourth node N24 and the first node N21 are electrically connected by the turned-on seventh transistor NT7.

Since the voltage of the fourth node N24 is the low level, the voltage of the first node N21 maintains the low level.

Since the voltage of the first node N21 is the low level, the ninth transistor NT9 is in the on state. The high level scan clock signal NCLK is provided to the output terminal 409 by the ninth transistor NT9 of the on state. Then, the stage NST0 of the scan driver 22 outputs the high level second scan signal NS[0].

At time tc7, the second clock signal ECLK2 is switched to the low level L. The scan clock signal NCLK maintains the high level, and the first clock signal ECLK1 maintains the high level.

Before the second clock signal ECLK2 is switched to the low level L, the second scan start signal NSSP is switched to the low level L.

The seventh transistor NT7 is in the off state by the low-level first clock signal ECLK1, and the eleventh transistor NT11 is in the off state by the scan clock signal NCLK of the high level H.

When the second clock signal ECLK2 of the low level L is supplied, the first transistor NT1 and the third transistor NT3 are turned on. Then, the turned-on first transistor NT1 electrically connects the eleventh transistor NT11 and the second node N22, and the second voltage VGL is supplied to the third node N23 through the turned-on third transistor NT3. Accordingly, the voltage of the second node N22 maintains the high level H, and the voltage of the third node N23 maintains the low level.

Since the voltage of the third node N23 is the low level, the fifth transistor NT5 and the sixth transistor NT6 are turned on. Since the first voltage VGH is provided to one end of the first capacitor NC1 connected to the fourth transistor NT4 through the turned-on fifth transistor NT5, the high level voltage is applied to opposite ends of the first capacitor NC1 to be discharged.

The first clock signal ECLK1 of the high level H is provided to the fourth node N24 through the turned-on sixth transistor NT6. Then, the second capacitor NC2 charges a voltage difference between the first clock signal ECLK1 of the high level H and the third node N23 of the low level.

After time tc8, the scan clock signal NCLK is switched to the low level. Then, the low level scan clock signal NCLK is provided to the output terminal 409 through the ninth transistor NT9 of the on state. In other words, the stage NST0 of the scan driver 22 outputs the low-level second scan signal NS[0].

Furthermore, at time tc9, the voltage of the first node N21 is a level L3 which is lower than the low level L.

After time tc18 when the scan clock signal NCLK is switched to the low level, the output of the high level scan signal NS[n] from the last stage INSTn to the second scan line NSn is terminated. Then, at time tc23, the holding control signal BPC is switched to the low level. In this case, the first clock signal ECLK1, the second clock signal ECLK2, and the scan clock signal NCLK may stop clocking.

When the holding control signal BPC is switched to the low level, since the second voltage VGL is supplied to the second node N22, the tenth transistor NT10 is turned on. Then, the second voltage VGL is supplied to the output terminal 409 through the turned-on tenth transistor NT10, in other words, all of the stages NST0 to NSTn of the second scan driver 22 maintain the output of the low-level second scan signals NS[0] to NS[n].

Therefore, the second scan driver 22 according to the present exemplary embodiment may maintain the second scan signals NS[0] to NS[n] at the high level for a predetermined period for the low-frequency driving of the display device.

As can be gleaned, in FIG. 17, the signal cycle of tc1 to tc23 repeats starting at tc24 and proceeding at least through tc29.

Hereinafter, an exemplary embodiment of the present invention in which the scan drivers 20, 21, and 22 and the holding portions 240, 340, and 440 of each of the light emission drivers 40 and 41 are provided as one constituent element will be described with reference to FIG. 18.

Figure 18:
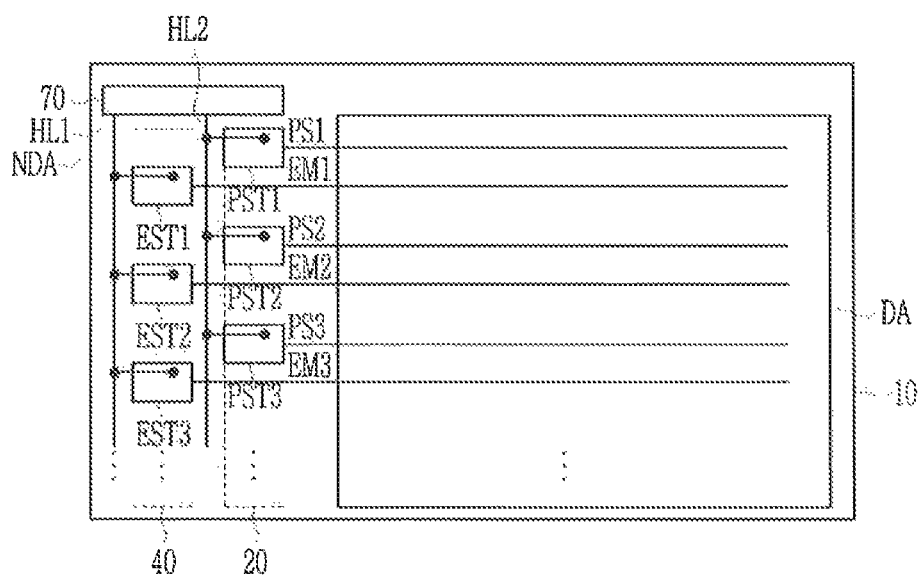
FIG. 18 illustrates a schematic diagram of a display device including a holding portion according to another exemplary embodiment of the present invention.

FIG. 18 illustrates a schematic diagram of a display device including a holding portion according to another exemplary embodiment of the present invention.

As shown in FIG. 18, a display unit 10 of the display device includes a display area DA for displaying an image and a non-display area NDA surrounding the display area DA.

The scan driver 20 and the light emission driver 40 may be positioned in the non-display area NDA. The scan driver 20 includes a plurality of stages (PST1, PST2, PST3, . . . ), and the light emission driver 40 includes a plurality of stages (EST1, EST2 EST3, . . . ).

In addition, a holding portion 70 may be positioned in the non-display area NDA. The holding portion 70 may be spaced apart from the scan driver 20 and the light emission driver 40.

The holding portion 70 includes at least one transistor and is connected to first and second holding lines HL1 and HL2. The first holding line HL1 is connected to all of the stages (EST1, EST2, EST3, . . . ) of the light emission driver 40, and the second holding line HL2 is connected to all of the stages (PST1, PST2, PST3, . . . ) of the scan driver 20.

For example, the first holding line HL1 is connected to the second node N12 of the stage EST1 shown in FIG. 10. The second holding line HL2 is connected to the first node N1 of the stage PST1 shown in FIG. 6. In addition, the second holding line HL2 is connected to the second node N22 of the stage NST0 shown in FIG. 1.6.

Then, the holding portion 70 provides the second voltage VGL to the first and second holding lines HL1 and HL2 depending on the level of the holding control signal BPC.

Exemplary embodiments of the present invention provide a driving device and a display device including the same that may apply signals with the same level for a relatively long period during low-frequency driving.

Exemplary embodiments of the present invention provide a driving device and a display device including the same that may apply signals with the same level without applying a clock signal during low-frequency driving.

According to exemplary embodiments of the present invention, it is possible to increase display quality of a display device.

According to exemplary embodiments of the present invention, it is possible to reduce power consumption of a display device.

According to exemplary embodiments of the present invention, it is possible to stably operate a display device.

While this invention has been particularly shown and described with reference to exemplary embodiments thereof, it will be understood by those of ordinary skill in the art that various modifications may be made thereto without departing from the spirit and scope of the present invention as defined by the appended claims.

What is claimed is:

1. A driving device, comprising:
 a plurality of stage circuits configured to output a high-level voltage or a low-level voltage,
 wherein each of the plurality of stage circuits includes:
 an output unit configured to supply the high-level voltage or the low-level voltage, to an output terminal in response to a voltage of a first node and a voltage of a second node;
 a first driver configured to control the voltage of the second node in response to a signal of a first input terminal, a signal of a third input terminal and a low-level voltage input terminal;
 a second driver configured to control the voltage of the first node in response to the signal of the first input terminal and a voltage of a third node; and
 a ninth transistor configured to apply the low-level voltage to the first node,
 wherein the output unit includes a fourth transistor that is positioned between a high-level voltage terminal and the output terminal, wherein a gate of the fourth transistor is connected to the first node,
 wherein the second driver includes a seventh transistor that is positioned between the first node and the low-level voltage input terminal, wherein a gate of the seventh transistor is connected to the first input terminal,
 wherein the ninth transistor is positioned between the first node and the low-level voltage input terminal, wherein a gate of the ninth transistor is connected to a fourth input terminal and a first terminal of the ninth transistor and a first terminal of the seventh transistor are directly connected to each other and to the first node,
 wherein when the fourth input terminals of all of the plurality of stage circuits receives simultaneously a holding control signal having an enable level after a signal is outputted from an output terminal of a last stage circuit, the fourth transistors of the plurality of stage circuits are turned on to output the high-level voltage to the output terminals of the plurality of stage circuits,
 wherein the enable level of the holding control signal is maintained until a time before a light-emission period in a low-frequency driving mode ends, and
 wherein the light-emission period in the low-frequency driving mode is longer than a plurality of frames in a normal driving mode.

2. The driving device of claim 1, wherein the third input terminal receives a signal outputted from an output terminal of a previous stage or a start signal, a second input terminal receives a second clock signal, and the first input terminal receives a first clock signal that has the same period as the second clock signal and a phase that does not overlap a phase of the second clock signal.

3. The driving device of claim 2, wherein the output unit includes:
 a fifth transistor that is positioned between the output terminal and the second input terminal, wherein a gate of the fifth transistor is connected to the second node;
 a first capacitor that is connected between the second node and the output terminal; and
 a second capacitor that is connected between the first node and the high-level voltage.

4. The driving device of claim 3, wherein the first driver controls the voltage of the second node in response to the first clock signal, and the first driver includes:
 a first transistor that is positioned between the third input terminal and the third node, wherein a gate of the first transistor is connected to the first input terminal; and
 a second transistor and a third transistor that are connected in series between the third node and the high-level voltage, wherein a gate of the second transistor is connected to the second input terminal, and a gate of the third transistor is connected to the first node.

5. The driving device of claim 4, wherein the second driver further includes:
 a sixth transistor that is positioned between the first node and the first input terminal, wherein a gate of the sixth transistor is connected to the third node; and
 the first driver further includes:
 an eighth transistor that is positioned between the second node and the third node, wherein a gate of the eighth transistor is connected to the low-level voltage.

* * * * *